United States Patent
Li et al.

(10) Patent No.: US 12,069,384 B2
(45) Date of Patent: Aug. 20, 2024

(54) IMAGE CAPTURE DEVICES HAVING PHASE DETECTION AUTO-FOCUS PIXELS

(71) Applicant: Apple Inc., Cupertino, CA (US)

(72) Inventors: Xiangli Li, Palo Alto, CA (US); Gilad Michael, Cupertino, CA (US); Lilong Shi, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 77 days.

(21) Appl. No.: 17/945,636

(22) Filed: Sep. 15, 2022

(65) Prior Publication Data

US 2023/0090827 A1  Mar. 23, 2023

Related U.S. Application Data

(60) Provisional application No. 63/247,734, filed on Sep. 23, 2021.

(51) Int. Cl.
 *H04N 25/13* (2023.01)
 *G06T 3/4015* (2024.01)
 (Continued)

(52) U.S. Cl.
 CPC ......... *H04N 25/135* (2023.01); *G06T 3/4015* (2013.01); *H01L 27/14645* (2013.01); *H04N 25/704* (2023.01)

(58) Field of Classification Search
 CPC .. H04N 25/135; H04N 25/704; H04N 25/134; G06T 3/4015; H01L 27/14645
 See application file for complete search history.

(56) References Cited

U.S. PATENT DOCUMENTS

| 4,686,572 | A | 8/1987 | Takatsu |
| 4,686,648 | A | 8/1987 | Fossum |

(Continued)

FOREIGN PATENT DOCUMENTS

| CN | 1630350 | 6/2005 |
| CN | 1774032 | 5/2006 |

(Continued)

OTHER PUBLICATIONS

Bermak, et al., "An 8/4-bit Reconfigurable Digital Pixel Array with On-Chip Non-Uniform Quantizer," IEEE 2005 Custom Integrated Circuits Conference, Sep. 19, 2005, XP010873783, ISBN 978-0-7803-9023-2, pp. 223-226.

(Continued)

*Primary Examiner* — Gevell V Selby
(74) *Attorney, Agent, or Firm* — Brownstein Hyatt Farber Schreck, LLP

(57) ABSTRACT

An image capture device is described. The image capture device includes an array of pixels, each pixel including a photodetector. A Bayer pattern color filter is disposed over a 4×4 subset of pixels in the array of pixels. The Bayer pattern color filter defines a first 2×2 subset of pixels sensitive to red light; a second 2×2 subset of pixels sensitive to green light; a third 2×2 subset of pixels sensitive to green light; and a fourth 2×2 subset of pixels sensitive to blue light. A set of 1×1 on-chip lenses (OCLs) includes a different 1×1 OCL disposed over each pixel in the second 2×2 subset of pixels and the third 2×2 subset of pixels. A set of 2×1 OCLs or 2×2 OCLs includes a 2×1 OCL or a 2×2 OCL disposed over each pixel in the first 2×2 subset of pixels and the fourth 2×2 subset of pixels.

17 Claims, 19 Drawing Sheets

(51) Int. Cl.
 *H01L 27/146* (2006.01)
 *H04N 25/704* (2023.01)

(56) References Cited

U.S. PATENT DOCUMENTS

| | | | |
|---|---|---|---|
| 5,105,264 A | 4/1992 | Erhardt et al. |
| 5,329,313 A | 7/1994 | Keith |
| 5,396,893 A | 3/1995 | Oberg et al. |
| 5,471,515 A | 11/1995 | Fossum et al. |
| 5,541,402 A | 7/1996 | Ackland |
| 5,550,677 A | 8/1996 | Schofield et al. |
| 5,781,312 A | 7/1998 | Noda |
| 5,841,126 A | 11/1998 | Fossum et al. |
| 5,880,459 A | 3/1999 | Pryor et al. |
| 5,949,483 A | 9/1999 | Fossum et al. |
| 6,008,486 A | 12/1999 | Stam et al. |
| 6,040,568 A | 3/2000 | Caulfield et al. |
| 6,233,013 B1 | 5/2001 | Hosier et al. |
| 6,348,929 B1 | 2/2002 | Acharya et al. |
| 6,448,550 B1 | 9/2002 | Nishimura |
| 6,528,833 B2 | 3/2003 | Lee et al. |
| 6,541,751 B1 | 4/2003 | Bidermann |
| 6,670,904 B1 | 12/2003 | Yakovlev |
| 6,713,796 B1 | 3/2004 | Fox |
| 6,714,239 B2 | 3/2004 | Guidash |
| 6,798,453 B1 | 9/2004 | Kaifu |
| 6,816,676 B2 | 11/2004 | Bianchi et al. |
| 6,905,470 B2 | 6/2005 | Lee et al. |
| 6,931,269 B2 | 8/2005 | Terry |
| 6,956,605 B1 | 10/2005 | Hashimoto |
| 6,982,759 B2 | 1/2006 | Goto |
| 7,075,049 B2 | 7/2006 | Rhodes et al. |
| 7,084,914 B2 | 8/2006 | Van Blerkom |
| 7,091,466 B2 | 8/2006 | Bock |
| 7,119,322 B2 | 10/2006 | Hong |
| 7,133,073 B1 | 11/2006 | Neter |
| 7,259,413 B2 | 8/2007 | Rhodes |
| 7,262,401 B2 | 8/2007 | Hopper et al. |
| 7,271,835 B2 | 9/2007 | Iizuka |
| 7,282,028 B2 | 10/2007 | Kim et al. |
| 7,319,218 B2 | 1/2008 | Krymski |
| 7,332,786 B2 | 2/2008 | Altice |
| 7,342,270 B2 | 3/2008 | Kuwazawa |
| 7,390,687 B2 | 6/2008 | Boettiger |
| 7,415,096 B2 | 8/2008 | Sherman |
| 7,437,013 B2 | 10/2008 | Anderson |
| 7,443,421 B2 | 10/2008 | Stavely et al. |
| 7,446,812 B2 | 11/2008 | Ando et al. |
| 7,471,315 B2 | 12/2008 | Silsby et al. |
| 7,502,054 B2 | 3/2009 | Kalapathy |
| 7,525,168 B2 | 4/2009 | Hsieh |
| 7,554,067 B2 | 6/2009 | Zarnoski et al. |
| 7,555,158 B2 | 6/2009 | Park et al. |
| 7,622,699 B2 | 11/2009 | Sakakibara et al. |
| 7,626,626 B2 | 12/2009 | Panicacci |
| 7,636,109 B2 | 12/2009 | Nakajima et al. |
| 7,671,435 B2 | 3/2010 | Ahn |
| 7,728,351 B2 | 6/2010 | Shim |
| 7,733,402 B2 | 6/2010 | Egawa et al. |
| 7,737,475 B2 | 6/2010 | Hynecek |
| 7,742,090 B2 | 6/2010 | Street |
| 7,764,312 B2 | 7/2010 | Ono et al. |
| 7,773,138 B2 | 8/2010 | Lahav et al. |
| 7,786,543 B2 | 8/2010 | Hsieh |
| 7,796,171 B2 | 9/2010 | Gardner |
| 7,817,198 B2 | 10/2010 | Kang et al. |
| 7,821,547 B2 | 10/2010 | Suzuki |
| 7,873,236 B2 | 1/2011 | Li et al. |
| 7,880,785 B2 | 2/2011 | Gallagher |
| 7,884,402 B2 | 2/2011 | Ki |
| 7,906,826 B2 | 3/2011 | Martin et al. |
| 7,952,121 B2 | 5/2011 | Arimoto |
| 7,952,635 B2 | 5/2011 | Lauxtermann |
| 7,982,789 B2 | 7/2011 | Watanabe et al. |
| 8,026,966 B2 | 9/2011 | Altice |
| 8,032,206 B1 | 10/2011 | Farazi et al. |
| 8,089,036 B2 | 1/2012 | Manabe et al. |
| 8,089,524 B2 | 1/2012 | Urisaka |
| 8,094,232 B2 | 1/2012 | Kusaka |
| 8,116,540 B2 | 2/2012 | Dean |
| 8,140,143 B2 | 3/2012 | Picard et al. |
| 8,153,947 B2 | 4/2012 | Barbier et al. |
| 8,159,570 B2 | 4/2012 | Negishi |
| 8,159,588 B2 | 4/2012 | Boemler |
| 8,164,669 B2 | 4/2012 | Compton et al. |
| 8,174,595 B2 | 5/2012 | Honda et al. |
| 8,184,188 B2 | 5/2012 | Yaghmai |
| 8,194,148 B2 | 6/2012 | Doida |
| 8,194,165 B2 | 6/2012 | Border et al. |
| 8,222,586 B2 | 7/2012 | Lee |
| 8,227,844 B2 | 7/2012 | Adkisson |
| 8,233,071 B2 | 7/2012 | Takeda |
| 8,241,205 B2 | 8/2012 | Mori |
| 8,259,228 B2 | 9/2012 | Wei et al. |
| 8,310,577 B1 | 11/2012 | Neter |
| 8,324,553 B2 | 12/2012 | Lee |
| 8,330,839 B2 | 12/2012 | Compton et al. |
| 8,338,856 B2 | 12/2012 | Tai et al. |
| 8,340,407 B2 | 12/2012 | Kalman |
| 8,350,940 B2 | 1/2013 | Smith et al. |
| 8,400,546 B2 | 3/2013 | Itano et al. |
| 8,441,545 B2 | 5/2013 | Hoda et al. |
| 8,456,540 B2 | 6/2013 | Egawa |
| 8,456,559 B2 | 6/2013 | Yamashita |
| 8,462,247 B2 | 6/2013 | Kim |
| 8,508,637 B2 | 8/2013 | Han et al. |
| 8,514,308 B2 | 8/2013 | Itonaga et al. |
| 8,520,913 B2 | 8/2013 | Dean |
| 8,546,737 B2 | 10/2013 | Tian et al. |
| 8,547,388 B2 | 10/2013 | Cheng |
| 8,575,531 B2 | 11/2013 | Hynecek et al. |
| 8,581,992 B2 | 11/2013 | Hamada |
| 8,594,170 B2 | 11/2013 | Mombers et al. |
| 8,619,163 B2 | 12/2013 | Ogua |
| 8,619,170 B2 | 12/2013 | Mabuchi |
| 8,629,484 B2 | 1/2014 | Ohri et al. |
| 8,634,002 B2 | 1/2014 | Kita |
| 8,648,947 B2 | 2/2014 | Sato et al. |
| 8,723,975 B2 | 5/2014 | Solhusvik |
| 8,730,345 B2 | 5/2014 | Watanabe |
| 8,754,983 B2 | 6/2014 | Sutton |
| 8,755,854 B2 | 6/2014 | Addison et al. |
| 8,759,736 B2 | 6/2014 | Yoo |
| 8,767,104 B2 | 7/2014 | Makino et al. |
| 8,803,990 B2 | 8/2014 | Smith |
| 8,810,703 B2 | 8/2014 | Machida |
| 8,817,154 B2 | 8/2014 | Manabe et al. |
| 8,860,871 B2 | 10/2014 | Aoki |
| 8,879,686 B2 | 11/2014 | Okada et al. |
| 8,902,330 B2 | 12/2014 | Theuwissen |
| 8,902,341 B2 | 12/2014 | Mabuchi |
| 8,908,062 B2 | 12/2014 | Ito |
| 8,908,073 B2 | 12/2014 | Minagawa |
| 8,923,994 B2 | 12/2014 | Laikari et al. |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,981,517 B2 | 3/2015 | Oshiyama et al. |
| 8,982,237 B2 | 3/2015 | Chen |
| 8,982,260 B2 | 3/2015 | Eshraghian et al. |
| 8,988,598 B2 | 3/2015 | Ovsiannikov |
| 9,001,251 B2 | 4/2015 | Smith et al. |
| 9,041,837 B2 | 5/2015 | Li |
| 9,017,748 B2 | 6/2015 | Spelman et al. |
| 9,054,009 B2 | 6/2015 | Oike et al. |
| 9,066,017 B2 | 6/2015 | Geiss |
| 9,066,660 B2 | 6/2015 | Watson et al. |
| 9,088,727 B2 | 7/2015 | Trumbo |
| 9,094,623 B2 | 7/2015 | Kawaguchi |
| 9,099,604 B2 | 8/2015 | Roy |
| 9,100,597 B2 | 8/2015 | Hu |
| 9,106,859 B2 | 8/2015 | Kizuna et al. |
| 9,131,171 B2 | 9/2015 | Aoki et al. |
| 9,154,750 B2 | 10/2015 | Pang |

(56) References Cited

U.S. PATENT DOCUMENTS

| | | |
|---|---|---|
| 9,160,949 B2 | 10/2015 | Zhang et al. |
| 9,225,948 B2 | 12/2015 | Hasegawa |
| 9,232,150 B2 | 1/2016 | Kleekajai et al. |
| 9,232,161 B2 | 1/2016 | Suh |
| 9,270,906 B2 | 2/2016 | Peng et al. |
| 9,276,031 B2 | 3/2016 | Wan |
| 9,277,144 B2 | 3/2016 | Kleekajai et al. |
| 9,287,304 B2 | 3/2016 | Park et al. |
| 9,287,423 B2 | 3/2016 | Mori et al. |
| 9,288,380 B2 | 3/2016 | Nomura |
| 9,288,404 B2 | 3/2016 | Papiashvili |
| 9,293,500 B2 | 3/2016 | Sharma et al. |
| 9,307,161 B2 | 4/2016 | Lee |
| 9,319,611 B2 | 4/2016 | Fan |
| 9,344,649 B2 | 5/2016 | Bock |
| 9,380,245 B1 | 6/2016 | Guidash |
| 9,392,237 B2 | 7/2016 | Toyoda |
| 9,438,258 B1 | 9/2016 | Yoo |
| 9,445,018 B2 | 9/2016 | Fettig et al. |
| 9,451,887 B2 | 9/2016 | Watson et al. |
| 9,467,553 B2 | 10/2016 | Heo et al. |
| 9,473,706 B2 | 10/2016 | Malone et al. |
| 9,479,688 B2 | 10/2016 | Ishii |
| 9,490,285 B2 | 11/2016 | Itonaga |
| 9,497,397 B1 | 11/2016 | Kleekajai et al. |
| 9,503,616 B2 | 11/2016 | Taniguchi et al. |
| 9,521,337 B1 | 12/2016 | Shen |
| 9,538,067 B2 | 1/2017 | Hamada |
| 9,538,106 B2 | 1/2017 | McMahon et al. |
| 9,549,099 B2 | 1/2017 | Fan |
| 9,571,758 B2 | 2/2017 | Hashimoto et al. |
| 9,584,743 B1 | 2/2017 | Lin et al. |
| 9,584,744 B2 | 2/2017 | Lenchenkov et al. |
| 9,596,420 B2 | 3/2017 | Fan et al. |
| 9,596,423 B1 | 3/2017 | Molgaard |
| 9,608,024 B2 | 3/2017 | Lee et al. |
| 9,609,250 B2 | 3/2017 | Lee et al. |
| 9,654,689 B2 | 5/2017 | Gleason |
| 9,661,210 B2 | 5/2017 | Haneda |
| 9,666,618 B2 | 5/2017 | Meynants |
| 9,686,485 B2 | 6/2017 | Agranov et al. |
| 9,700,240 B2 | 7/2017 | Letchner et al. |
| 9,741,754 B2 | 8/2017 | Li et al. |
| 9,749,556 B2 | 8/2017 | Fettig et al. |
| 9,754,994 B2 | 9/2017 | Koo et al. |
| 9,774,318 B2 | 9/2017 | Song |
| 9,781,368 B2 | 10/2017 | Song |
| 9,819,890 B2 | 11/2017 | Wang et al. |
| 9,857,469 B2 | 1/2018 | Oggier et al. |
| 9,888,198 B2 | 2/2018 | Mauritzson et al. |
| 9,894,304 B1 | 2/2018 | Smith |
| 9,912,883 B1 | 3/2018 | Lee |
| 9,918,031 B2 | 3/2018 | Sakioka et al. |
| 9,936,105 B2 | 4/2018 | Furuya |
| 9,936,151 B2 | 4/2018 | Wang et al. |
| 9,952,323 B2 | 4/2018 | Deane |
| 9,973,678 B2 | 5/2018 | Mandelli et al. |
| 10,044,954 B2 | 8/2018 | Ikeda et al. |
| 10,051,217 B2 | 8/2018 | Kondo et al. |
| 10,104,318 B2 | 10/2018 | Smith et al. |
| 10,120,446 B2 | 11/2018 | Pance et al. |
| 10,136,090 B2 | 11/2018 | Vogelsang et al. |
| 10,178,329 B2 | 1/2019 | Vogelsang et al. |
| 10,212,378 B2 | 2/2019 | Negishi |
| 10,217,889 B2 | 2/2019 | Dhulla et al. |
| 10,249,660 B2 | 4/2019 | Guidash et al. |
| 10,250,833 B2 | 4/2019 | Wang et al. |
| 10,263,032 B2 | 4/2019 | Wan |
| 10,269,857 B2 | 4/2019 | Wu et al. |
| 10,271,037 B2 | 4/2019 | Oh |
| 10,285,626 B1 | 5/2019 | Kestelli et al. |
| 10,306,167 B2 | 5/2019 | Shimasaki |
| 10,334,181 B2 | 6/2019 | Guenter et al. |
| 10,379,317 B2 | 8/2019 | Shimokawa et al. |
| 10,205,904 B2 | 9/2019 | Kobayashi |
| 10,431,608 B2 | 10/2019 | Ebihara |
| 10,440,301 B2 | 10/2019 | Li et al. |
| 10,447,950 B2 | 10/2019 | Wang |
| 10,484,627 B2 | 11/2019 | Zhou |
| 10,609,348 B2 | 3/2020 | Agranov et al. |
| 10,630,920 B2 | 4/2020 | Matsunaga |
| 10,630,929 B2 | 4/2020 | Koizumi et al. |
| 10,748,955 B2 | 8/2020 | Oh et al. |
| 10,775,605 B2 | 9/2020 | Ollila |
| 10,848,693 B2 | 11/2020 | Agranov et al. |
| 10,854,647 B2 | 12/2020 | Huang |
| 10,943,935 B2 | 3/2021 | Li et al. |
| 10,943,940 B2 | 3/2021 | Wu et al. |
| 10,951,838 B2 | 3/2021 | Eyama |
| 11,019,294 B2 | 5/2021 | McMahon |
| 11,252,381 B2 | 2/2022 | Pang et al. |
| 11,258,993 B2 | 2/2022 | Hoshino |
| 11,350,052 B2 | 5/2022 | Otaka |
| 11,405,575 B2 | 7/2022 | Bairo |
| 11,546,532 B1 | 1/2023 | Bahukhandi et al. |
| 11,563,910 B2 | 1/2023 | Li et al. |
| 2003/0036685 A1 | 2/2003 | Goodman et al. |
| 2004/0207836 A1 | 10/2004 | Chhibber et al. |
| 2005/0026332 A1 | 2/2005 | Fratti et al. |
| 2006/0274161 A1 | 12/2006 | Ing et al. |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0146234 A1 | 6/2009 | Luo et al. |
| 2009/0201400 A1 | 8/2009 | Zhang et al. |
| 2009/0219266 A1 | 9/2009 | Lim et al. |
| 2010/0134631 A1 | 6/2010 | Voth |
| 2011/0080500 A1 | 4/2011 | Wang et al. |
| 2011/0109776 A1 | 5/2011 | Kawai |
| 2011/0156197 A1 | 6/2011 | Tivarus et al. |
| 2011/0164162 A1 | 7/2011 | Kato |
| 2012/0092541 A1 | 4/2012 | Tuulos et al. |
| 2013/0147981 A1 | 6/2013 | Wu |
| 2014/0071321 A1 | 3/2014 | Seyama |
| 2014/0078356 A1 | 3/2014 | Vaartstra |
| 2015/0062391 A1 | 3/2015 | Murata |
| 2016/0050379 A1 | 2/2016 | Jiang et al. |
| 2016/0219232 A1 | 7/2016 | Murata |
| 2016/0344920 A1 | 11/2016 | Iwahara |
| 2017/0047363 A1 | 2/2017 | Choi et al. |
| 2017/0104942 A1* | 4/2017 | Hirota ............... H04N 25/704 |
| 2018/0160067 A1* | 6/2018 | Sakioka ............ H04N 25/46 |
| 2021/0281789 A1 | 9/2021 | McMahon |
| 2022/0102414 A1* | 3/2022 | Lee .................. H04N 25/42 |
| 2022/0190023 A1* | 6/2022 | Jeong ............ H01L 27/14643 |
| 2022/0375986 A1 | 11/2022 | Rosenblum et al. |
| 2023/0044950 A1 | 2/2023 | Bock et al. |

FOREIGN PATENT DOCUMENTS

| | | |
|---|---|---|
| CN | 1833429 | 9/2006 |
| CN | 1842138 | 10/2006 |
| CN | 1947414 | 4/2007 |
| CN | 101189885 | 5/2008 |
| CN | 101221965 | 7/2008 |
| CN | 101233763 | 7/2008 |
| CN | 101472059 | 7/2009 |
| CN | 101567977 | 10/2009 |
| CN | 101622859 | 1/2010 |
| CN | 101739955 | 6/2010 |
| CN | 101754029 | 6/2010 |
| CN | 101803925 | 8/2010 |
| CN | 102036020 | 4/2011 |
| CN | 102067584 | 5/2011 |
| CN | 102208423 | 10/2011 |
| CN | 102451160 | 5/2012 |
| CN | 102668542 | 9/2012 |
| CN | 102820309 | 12/2012 |
| CN | 102821255 | 12/2012 |
| CN | 103024297 | 4/2013 |
| CN | 103051843 | 4/2013 |
| CN | 103329513 | 9/2013 |

(56) References Cited

FOREIGN PATENT DOCUMENTS

| | | |
|---|---|---|
| CN | 103546702 | 1/2014 |
| CN | 104041009 | 9/2014 |
| CN | 104052919 | 9/2014 |
| CN | 204761615 | 11/2015 |
| CN | 205211754 | 5/2016 |
| EP | 814606 | 2/2002 |
| EP | 1763228 | 3/2007 |
| EP | 2023611 | 2/2009 |
| EP | 2107610 | 10/2009 |
| EP | 2230690 | 9/2010 |
| EP | 2512126 | 10/2012 |
| GB | 2601833 | 6/2022 |
| JP | S61123287 | 6/1986 |
| JP | 2000059697 | 2/2000 |
| JP | 2001211455 | 8/2001 |
| JP | 2001358994 | 12/2001 |
| JP | 2004111590 | 4/2004 |
| JP | 2005318504 | 11/2005 |
| JP | 2006287361 | 10/2006 |
| JP | 2007504670 | 3/2007 |
| JP | 2007516654 | 6/2007 |
| JP | 2008507908 | 3/2008 |
| JP | 2008271280 | 11/2008 |
| JP | 2008543061 | 11/2008 |
| JP | 2009021809 | 1/2009 |
| JP | 4255223 | 4/2009 |
| JP | 2009159186 | 7/2009 |
| JP | 2009212909 | 9/2009 |
| JP | 2009296465 | 12/2009 |
| JP | 2010080604 | 4/2010 |
| JP | 2010114834 | 5/2010 |
| JP | 2011040926 | 2/2011 |
| JP | 2011049697 | 3/2011 |
| JP | 2011091775 | 5/2011 |
| JP | 2011216970 | 10/2011 |
| JP | 2011217315 | 10/2011 |
| JP | 2011097646 | 12/2011 |
| JP | 2012010306 | 1/2012 |
| JP | 2012019516 | 1/2012 |
| JP | 2012513160 | 6/2012 |
| JP | 2013005397 | 1/2013 |
| JP | 2013051523 | 3/2013 |
| JP | 2013070240 | 4/2013 |
| JP | 2013529035 | 7/2013 |
| KR | 20030034424 | 5/2003 |
| KR | 20030061157 | 7/2003 |
| KR | 20050103732 | 11/2005 |
| KR | 2008/0069851 | 7/2008 |
| KR | 20100008239 | 1/2010 |
| KR | 20100065084 | 6/2010 |
| KR | 20130074459 | 7/2013 |
| TW | 200520551 | 6/2005 |
| TW | 200803481 | 1/2008 |
| TW | 201110689 | 3/2011 |
| TW | 201301881 | 1/2013 |
| WO | WO 05/041304 | 5/2005 |
| WO | WO 06/014641 | 2/2006 |
| WO | WO 06/130443 | 12/2006 |
| WO | WO 07/049900 | 5/2007 |
| WO | WO 10/120945 | 10/2010 |
| WO | WO 12/053363 | 4/2012 |
| WO | WO 12/088338 | 6/2012 |
| WO | WO 12/122572 | 9/2012 |
| WO | WO 12/138687 | 10/2012 |
| WO | WO 13/008425 | 1/2013 |
| WO | WO 13/179018 | 12/2013 |
| WO | WO 13/179020 | 12/2013 |
| WO | WO 19/102887 | 5/2019 |
| WO | WO 20/228392 | 11/2020 |

OTHER PUBLICATIONS

Li et al., "Smart Image Sensor with Integrated Low Complexity Image Processing for Wireless Endoscope Capsules," *Tsinghua Science and Technology*, vol. 14, No. 5, Oct. 2009, pp. 586-592.

Aoki, et al., "Rolling-Shutter Distortion-Free 3D Stacked Image Sensor with −160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.IEEE.org/stamp/stamp.jsp?tp-&arnumber=6487824.

Elgendi, "On the Analysis of Fingertip Photoplethysmogram Signals," *Current Cardiology Reviews*, 2012, vol. 8, pp. 14-25.

Feng, et al., "On the Stoney Formula for a Thin Film/Substrate System with Nonuniform Substrate Thickness," *Journal of Applied Mechanics*, Transactions of the ASME, vol. 74, Nov. 2007, pp. 1276-1281.

Fontaine, "The State-of-the-Art of Smartphone Imagers," 2019 International Image Sensor Workshop, Snowbird, Utah, Jun. 23-27, 2019, 3 pages.

Fu, et al., "Heart Rate Extraction from Photoplethysmogram Waveform Using Wavelet Multi-resolution Analysis," *Journal of Medical and Biological Engineering*, 2008, vol. 28, No. 4, pp. 229-232.

Han, et al., "Artifacts in wearable photoplethysmographs during daily life motions and their reduction with least mean square based active noise cancellation method," *Computers in Biology and Medicine*, 2012, vol. 42, pp. 387-393.

Jang et al., "A new PDAF correction method of CMOS image sensor with Nonacell and Super PD to improve image quality in binning mode," IS&T International Symposium on Electronic Imaging 2021, Image Quality and System Performance XVIII, 5 pages.

Lopez-Silva, et al., "Heuristic Algorithm for Photoplethysmographic Heart Rate Tracking During Maximal Exercise Test," *Journal of Medical and Biological Engineering*, 2011, vol. 12, No. 3, pp. 181-188.

Santos, et al., "Accelerometer-assisted PPG Measurement During Physical Exercise Using the LAVIMO Sensor System," *Acta Polytechnica*, 2012, vol. 52, No. 5, pp. 80-85.

Sarkar, et al., "Fingertip Pulse Wave (PPG signal) Analysis and Heart Rate Detection," *International Journal of Emerging Technology and Advanced Engineering*, 2012, vol. 2, No. 9, pp. 404-407.

Schwarzer, et al., On the determination of film stress from substrate bending: Stoney's formula and its limits, Jan. 2006, 19 pages.

Shen et al., "Stresses, Curvatures, and Shape Changes Arising from Patterned Lines on Silicon Wafers," Journal of Applied Physics, vol. 80, No. 3, Aug. 1996, pp. 1388-1398.

Yan, et al., "Reduction of motion artifact in pulse oximetry by smoothed pseudo Wigner-Ville distribution," *Journal of NeuroEngineering and Rehabilitation*, 2005, vol. 2, No. 3, pp. 1-9.

Yousefi, et al., "Adaptive Cancellation of Motion Artifact in Wearable Biosensors," 34th Annual International Conference of the IEEE EMBS, San Diego, California, Aug./Sep. 2012, pp. 2004-2008.

\* cited by examiner

IMAGE CAPTURE DEVICES HAVING PHASE DETECTION AUTO-FOCUS PIXELS

CROSS-REFERENCE TO RELATED APPLICATION

This application is a nonprovisional and claims the benefit under 35 U.S.C. 119(e) of U.S. Provisional Patent Application No. 63/247,734, filed Sep. 23, 2021, the contents of which are incorporated herein by reference as if fully disclosed herein.

FIELD

The described embodiments relate generally to devices having a camera or other image capture device. More particularly, the described embodiments relate to an image capture device having phase detection auto-focus (PDAF) pixels.

BACKGROUND

Digital cameras and other image capture devices use an image sensor, such as a complementary metal-oxide-semiconductor (CMOS) image sensor or a charge-coupled device (CCD) image sensor, to capture an image. In some cases, a camera or other image capture device may include multiple image sensors, with the different image sensors having adjacent or interlaced arrays of pixels.

Many cameras and other image capture devices include one or more optical components (e.g., a lens or lens assembly) that are configurable to focus light, received or reflected from an image, onto the surface of an image sensor. Before or while capturing an image, the distance between the optical component(s) and image sensor (or a tilt or other parameters of the optical components or image sensor) may be adjusted to focus an image onto the image sensor. In some cases, macro (or rough) focusing may be performed for an image sensor prior to capturing an image using the image sensor (e.g., using a macro focus mechanism adjacent the image sensor). Micro (or fine) focusing can then be performed after acquiring one or more images using the image sensor. In other cases, all focusing may be performed prior to capturing an image (e.g., by adjusting one or more relationships between a lens, lens assembly, or image sensor); or all focusing may be performed after acquiring an image (e.g., by adjusting pixel values using one or more digital image processing algorithms). Many cameras and other image capture devices perform focusing operations frequently, and in some cases before and/or after the capture of each image capture frame.

Focusing an image onto an image sensor often entails identifying a perceptible edge between objects, or an edge defined by different colors or brightness (e.g., an edge between dark and light regions), and making adjustments to a lens, lens assembly, image sensor, or pixel value(s) to bring the edge into focus.

SUMMARY

Embodiments of the systems, devices, methods, and apparatus described in the present disclosure are directed to an image capture device having PDAF pixels.

In a first aspect, the present disclosure describes an image capture device. The image capture device may include an array of pixels, with each pixel including a photodetector. A Bayer pattern color filter may be disposed over a 4×4 subset of pixels in the array of pixels. The Bayer pattern color filter may define a first 2×2 subset of pixels sensitive to red light; a second 2×2 subset of pixels sensitive to green light; a third 2×2 subset of pixels sensitive to green light; and a fourth 2×2 subset of pixels sensitive to blue light. A set of 1×1 on-chip lenses (OCLs) may include a different 1×1 OCL disposed over each pixel in the second 2×2 subset of pixels and the third 2×2 subset of pixels. A set of 2×1 OCLs or 2×2 OCLs may include a 2×1 OCL or a 2×2 OCL disposed over each pixel in the first 2×2 subset of pixels and the fourth 2×2 subset of pixels.

In a second aspect, the present disclosure describes another image capture device. The image capture device may include an array of pixels, with each pixel including a photodetector. A color filter pattern may be disposed over a 4×4 subset of pixels in the array of pixels. The color filter pattern may define a first 2×2 subset of pixels sensitive to red light; a second 2×2 subset of pixels sensitive to green light; a third 2×2 subset of pixels sensitive to green light; and a fourth 2×1 subset of pixels sensitive to green light. A set of 1×1 OCLs may include a different 1×1 OCL disposed over each pixel in the second 2×2 subset of pixels and the third 2×2 subset of pixels. A set of 2×1 OCLs or 2×2 OCLs may include a 2×1 OCL or a 2×2 OCL disposed over each pixel in the first 2×2 subset of pixels and the fourth 2×2 subset of pixels. A fifth 2×1 subset of pixels in the 4×4 subset of pixels may be covered by an opaque material.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
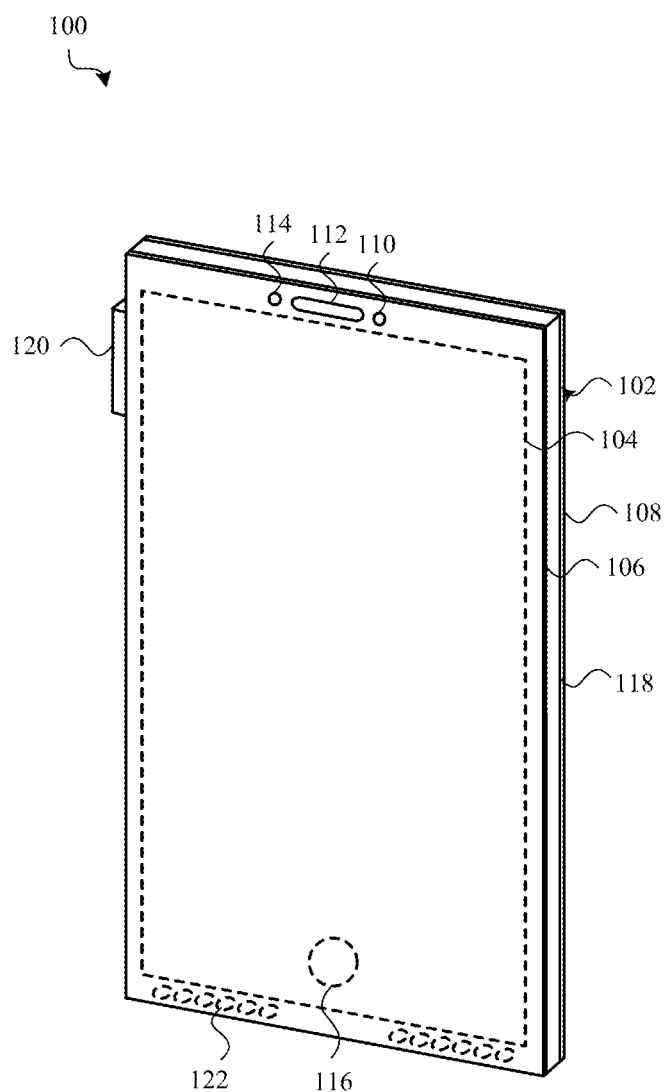
FIGS. 1A and 1B show an example of a device that may include one or more image capture devices.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The present disclosure relates to an image capture device that provides improved PDAF performance.

In some cases, PDAF pixels (i.e., pixels configured to collect PDAF information) may have a metal shield configuration. A metal shield pixel may include a microlens that focuses incoming light on a photodiode, which photodiode in turn converts photons into electron (or hole) pairs. The collected electrons (for electron collection devices) or holes (for hole collection devices) may be converted into an analog voltage through a pixel source follower (SF) transistor amplifier. The analog voltage may then be converted to a digital signal by an analog-to-digital converter (ADC). A metal shield (e.g., a Tungsten (W) or Copper/Aluminum (Cu/Al) metal shield) may cover half of the photodiode (e.g., a left half or a right half). For a left-shielded pixel, light from left-incident angles is blocked by the metal shield, and only light approaching the pixel from right-incident angles is received by the photodiode. A right-shielded pixel functions in the opposite manner. The angular sensitivity of left and right metal shield pixels can be used to generate PDAF information.

Because the signal (e.g., the analog voltage or digital signal) generated by a metal shield pixel will be much lower than the signal generated by an unshielded (or regular) pixel, metal-shielded pixels need to be treated as defective pixels, and their signals need to be corrected before being used to generate an image. To minimize the effect that signal correction may have on image quality, metal shield pixels (or pairs of left/right-shielded pixels) may be sparsely distributed over the surface of an image sensor. That is, a relatively small number of an image sensor's pixels (e.g., 3-4%) may be configured as left- or right-shielded pixels. In one example, for every eight rows and eight columns of pixels (e.g., for every block of 64 pixels in a pixel array), one left-shielded pixel and one right-shielded pixel may be provided.

At a vertical edge within an image (e.g., at an edge defined by a perceptible edge between objects, or at an edge defined by different colors or brightness (e.g., an edge between dark and light regions)), left- and right-shielded pixels will have disparate signals (e.g., signals not matched in magnitude and/or polarity) when an image is not in focus, but will have well-matched signals when an image is in focus. The signals of left- and right-shielded pixels therefore provide PDAF information that can be used by an auto-focus (AF) mechanism to adjust the position of one or more optical components (e.g., a lens) or an image sensor, and thereby adjust the focus of an image on the image sensor, or to digitally adjust or compensate for an out-of-focus condition. In some cases, an image may be brought into focus based on a PDAF information obtained during a single image capture frame. By analyzing PDAF information obtained during each image capture frame, images may be quickly and continuously focused on an image sensor.

In some embodiments, left- and right-shielded pixels may be fabricated without metal shields by placing both pixels adjacent one another under a single microlens. Each pixel may have its own photodiode, and there may be implant isolation or physical trench isolation between the photodiodes of the two pixels. Because of the nature (e.g., curvature) of the microlens, light from left-incident angles is received mainly by the left-side pixel, and light from right-incident angles is received mainly by the right-side pixel. As a result, left- and right-side pixels placed adjacent one another under a single microlens may function similarly to left and right metal shielded pixels. In a Bayer pattern pixel configuration (i.e., a repetitive 2×2 pattern including red pixels and blue pixels along one diagonal, and green pixels along the other diagonal), one blue pixel in every 8×8 block of pixels may be replaced by a green pixel (or may be modified to function as a green pixel), so that two adjacent green pixels may be placed under a single microlens to provide PDAF information. The signals of both pixels need to be corrected before being used to generate an image.

Because the signals provided by metal shield pixels, or the signals provided by adjacent pixels under a microlens, need to be corrected before being used to generate an image, the density of such pixels may be kept low. However, this provides limited PDAF information, which in turn degrades AF performance (especially in low light conditions). To improve PDAF performance, each pixel in a pixel array may be divided into left and right sub-pixels, and PDAF information may be obtained from each pixel. Also, because all pixels are implemented in a similar manner, the sub-pixel signals for each pixel may be combined in a similar way, or signal corrections may be made to each pixel in a similar way, to increase the confidence level that pixel signals are being generated or corrected appropriately (especially in low light conditions). However, the PDAF information provided by such a pixel array (and by all pixel arrays using metal shield pixels or adjacent pixels under a single microlens) bases image focus entirely on vertical edges. For an image containing few vertical edges or more horizontal edges, or for an image acquired under a low light condition, PDAF performance may suffer. For example, it may be difficult or impossible to focus an image on an image sensor, or it may take longer than desired to focus an image on an image sensor.

In some cases, the pixels in a pixel array may be grouped in 2×2 subsets of pixels, with each pixel having a corresponding photodetector. In some cases, each 2×2 subset of pixels may be disposed under a different microlens. In some embodiments, the entirety of a pixel array may incorporate such 2×2 subsets of pixels. The pixels can be used, in various embodiments or configurations, to provide PDAF information based on edges having more than one orientation (e.g., vertical and horizontal edges), to improve PDAF performance (especially in low light conditions), to reduce or eliminate the need for signal correction, or to increase the resolution of an image sensor. However, the shared microlens over a 2×2 subset of pixels may tend to reduce the signal-to-noise ratio (SNR) of the signals generated by the pixels. When the shared microlens is shifted as a result of manufacturing variance, the SNR of some pixels may be reduced even further, and the SNR of each pixel may differ (i.e., each of the four pixels positioned under a shared microlens may have a different SNR). This greatly increases the processing burden (e.g., including lens offset or misalignment correction, re-mosaicing burden, and so on) that is needed to correct the signals produced by the various pixels, and can lead to image resolution loss as a result of the lens offset or misalignment correction and other factors.

Disclosed herein is an image capture device in which an array of pixels may be divided into 4×4 subsets of pixels. A 4×4 subset of pixels may be further divided into four quadrants. A respective Bayer pattern color filter (or other color filter pattern) may be disposed over each (or at least some) of the 4×4 subsets of pixels. The Bayer pattern color filter may define a first 2×2 subset of pixels sensitive to red light; a second 2×2 subset of pixels sensitive to green light; a third 2×2 subset of pixels sensitive to green light; and a fourth 2×2 subset of pixels sensitive to blue light. A set of 1×1 OCLs may include a different 1×1 OCL disposed over each pixel in the second 2×2 subset of pixels and the third 2×2 subset of pixels. A set of 2×1 OCLs or 2×2 OCLs may include a 2×1 OCL or a 2×2 OCL disposed over each pixel in the first 2×2 subset of pixels and the fourth 2×2 subset of pixels.

Also disclosed herein is another image capture device in which an array of pixels may be divided into 4×4 subsets of pixels. A 4×4 subset of pixels may be further divided into four quadrants. A respective color filter pattern may be disposed over some of the 4×4 subsets of pixels. The color filter pattern may define a first 2×2 subset of pixels sensitive to red light; a second 2×2 subset of pixels sensitive to green light; a third 2×2 subset of pixels sensitive to green light; and a fourth 2×1 subset of pixels sensitive to green light. A set of 1×1 OCLs may include a different 1×1 OCL disposed over each pixel in the second 2×2 subset of pixels and the third 2×2 subset of pixels. A set of 2×1 OCLs or 2×2 OCLs may include a 2×1 OCL or a 2×2 OCL disposed over each pixel in the first 2×2 subset of pixels and the fourth 2×2 subset of pixels. A fifth 2×1 subset of pixels in the 4×4 subset of pixels may be covered by an opaque material.

In some embodiments, the Bayer color filter pattern described above may be disposed over most 4×4 subsets of pixels in an array of pixels, and the other color filter pattern may be disposed over at least some of the remaining 4×4 subsets of pixels.

These and other embodiments are described with reference to FIGS. 1A-12. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration and is not always limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

Figure 1B:
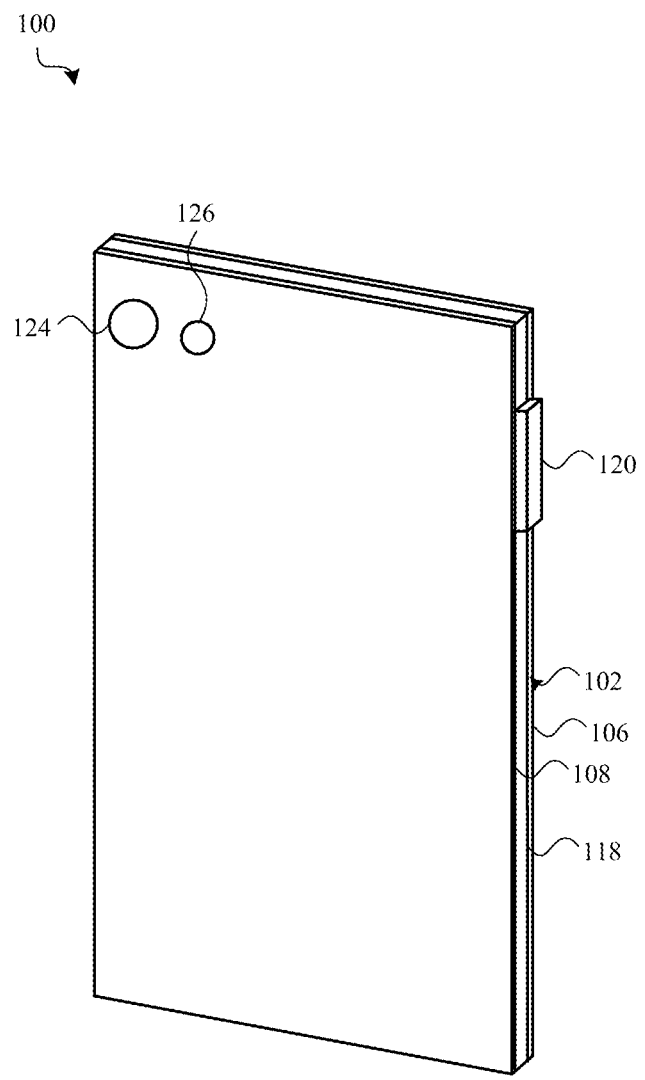

FIGS. 1A and 1B show an example of a device 100 that may include one or more image capture devices. The device's dimensions and form factor, including the ratio of the length of its long sides to the length of its short sides, suggest that the device 100 is a mobile phone (e.g., a smart phone). However, the device's dimensions and form factor are arbitrarily chosen, and the device 100 could alternatively be any portable electronic device including, for example, a mobile phone, tablet computer, portable computer, portable music player, electronic watch, health monitor device, portable terminal, vehicle navigation system, robot navigation system, or other portable or mobile device. The device 100 could also be a device that is semi-permanently located (or installed) at a single location. FIG. 1A shows a front isometric view of the device 100, and FIG. 1B shows a rear isometric view of the device 100. The device 100 may include a housing 102 that at least partially surrounds a display 104. The housing 102 may include or support a front cover 106 or a rear cover 108. The front cover 106 may be positioned over the display 104, and may provide a window through which the display 104 may be viewed. In some embodiments, the display 104 may be attached to (or abut) the housing 102 and/or the front cover 106. In alternative embodiments of the device 100, the display 104 may not be included and/or the housing 102 may have an alternative configuration.

The display 104 may include one or more light-emitting elements including, for example, light-emitting diodes (LEDs), organic LEDs (OLEDs), a liquid crystal display (LCD), an electroluminescent (EL) display, or other types of display elements. In some embodiments, the display 104 may include, or be associated with, one or more touch and/or force sensors that are configured to detect a touch and/or a force applied to a surface of the front cover 106.

The various components of the housing 102 may be formed from the same or different materials. For example, the sidewall 118 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The rear cover 108 may be formed using the same material(s) that are used to form the sidewall 118 or the front cover 106. In some cases, the rear cover 108 may be part of a monolithic element that also forms the sidewall 118 (or in cases where the sidewall 118 is a multi-segment sidewall, those portions of the sidewall 118 that are non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 106 (e.g., to a display surface of the device 100).

In some cases, a force sensor (or part of a force sensor system) may be positioned within the interior volume below and/or to the side of the display 104 (and in some cases within the device stack). The force sensor (or force sensor system) may be triggered in response to the touch sensor detecting one or more touches on the front cover 106 (or a location or locations of one or more touches on the front cover 106), and may determine an amount of force associated with each touch, or an amount of force associated with the collection of touches as a whole. Alternatively, the touch sensor (or touch sensor system) may be triggered in response to the force sensor detecting one or more forces on the front cover 106. In some cases, the force sensor may be used as (e.g., as an alternative to) a separate touch sensor.

As shown primarily in FIG. 1A, the device 100 may include various other components. For example, the front of the device 100 may include one or more front-facing cameras 110 or other image capture devices (including one or more image sensors), speakers 112, microphones, or other components 114 (e.g., audio, imaging, and/or sensing components) that are configured to transmit or receive signals to/from the device 100. In some cases, a front-facing camera 110, alone or in combination with other sensors, may be configured to operate as a bio-authentication or facial recognition sensor. The device 100 may also include various input devices, including a mechanical or virtual button 116, which may be accessible from the front surface (or display surface) of the device 100. In some embodiments, the front-facing camera 110, one or more other cameras, and/or one or more other optical emitters, optical detectors, or other optical sensors may be positioned under the display 104 instead of adjacent the display 104. In these embodiments, the camera(s), optical emitter(s), optical detector(s), or sensor(s) may emit and/or receive light through the display 104.

The device 100 may also include buttons or other input devices positioned along the sidewall 118 and/or on a rear surface of the device 100. For example, a volume button or multipurpose button 120 may be positioned along the sidewall 118, and in some cases may extend through an aperture in the sidewall 118. The sidewall 118 may include one or more ports 122 that allow air, but not liquids, to flow into and out of the device 100. In some embodiments, one or more sensors may be positioned in or near the port(s) 122. For example, an ambient pressure sensor, ambient temperature sensor, internal/external differential pressure sensor, gas sensor, particulate matter concentration sensor, or air quality sensor may be positioned in or near a port 122.

In some embodiments, the rear surface of the device 100 may include a rear-facing camera 124 or other image capture device (including one or more image sensors; see FIG. 1B). A flash or light source 126 may also be positioned along the rear surface of the device 100 (e.g., near the rear-facing camera). In some cases, the rear surface of the device 100 may include multiple rear-facing cameras.

Figure 2:
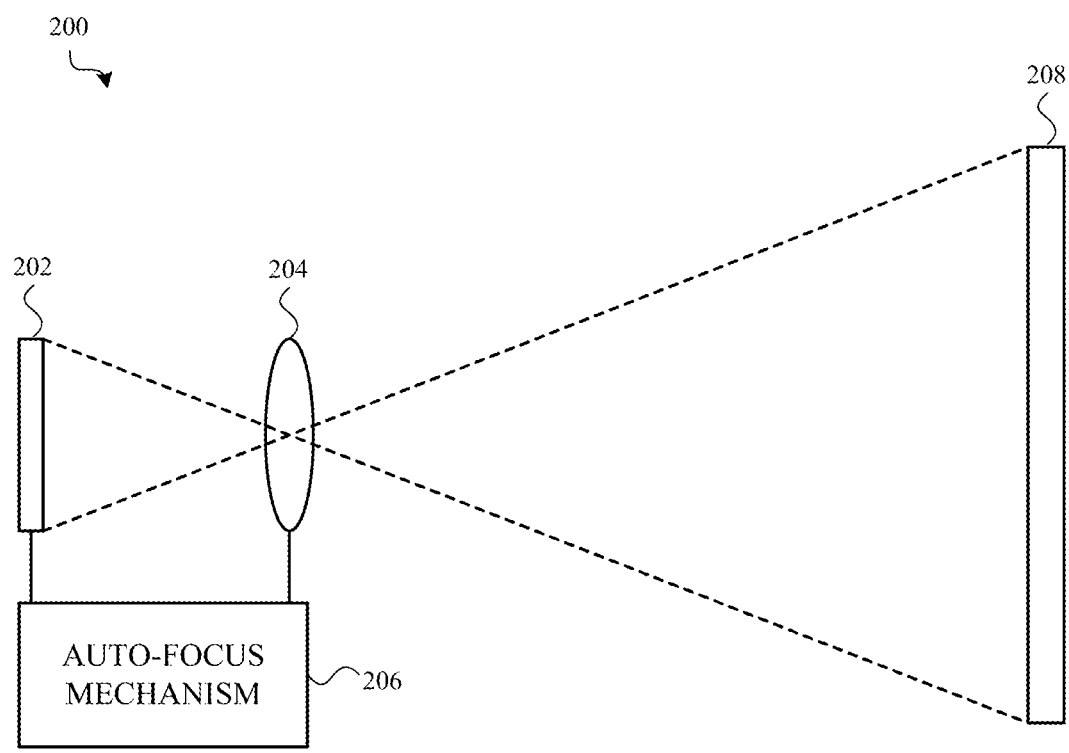
FIG. 2 shows an example embodiment of an image capture device, including an image sensor, a lens or lens assembly, and an auto-focus mechanism.

FIG. 2 shows an example embodiment of an image capture device (e.g., a camera 200), including an image sensor 202, a lens 204 or lens assembly, and a mechanical auto-focus mechanism 206. In some embodiments, the components shown in FIG. 2 may be associated with the first camera 110 or the second camera 124 shown in FIGS. 1A-1B.

The image sensor 202 may include a plurality of pixels, such as an array of pixels arranged in 4×4 subsets of pixels. Each pixel may be associated with a photodetector. The photodetectors associated with different pixels may be electrically isolated from each other. As will be described with reference to other figures, different OCLs may be disposed over different pixels, over different pairs of pixels, or over different 2×2 subsets of pixels. photodetectors.

The lens 204 may be adjustable with respect to the image sensor 202, to focus an image of a scene 208 on the image sensor 202. In some embodiments, the lens 204 or lens assembly may be moved with respect to the image sensor 202 (e.g., moved to change a distance between the lens 204 or lens assembly and the image sensor 202, moved to change an angle between a plane of a lens 204 or lenses and a plane of the image sensor 202, and so on). In other embodiments, the image sensor 202 may be moved with respect to the lens 204 or lens assembly.

In some embodiments, the auto-focus mechanism 206 may include (or the functions of the auto-focus mechanism 206 may be provided by) a processor in combination with a voice coil, piezoelectric element, or other actuator mechanism that moves the lens 204, lens assembly, or image sensor 202. The auto-focus mechanism 206 may receive signals from the image sensor 202 and, in response to the signals, adjust a focus setting of the camera 200. In some embodiments, the signals may include PDAF information. The PDAF information may include horizontal phase detection signals, vertical phase detection signals, and/or other phase detection signals. In response to the PDAF information (e.g., in response to an out-of-focus condition identified from the PDAF information), the auto-focus mechanism 206 may adjust a focus setting of the camera 200 by, for example, adjusting a relationship between the image sensor 202 (or plurality of pixels) and the lens 204 or lens assembly (e.g., by adjusting a physical position of the lens 204, lens assembly, or image sensor 202). Additionally or alternatively, the processor of the auto-focus mechanism 206 may use digital image processing techniques to adjust the values output by the pixels and/or photodetectors of the image sensor 202. The values may be adjusted to digitally improve, or otherwise alter, the focus of an image of the scene 208. In some embodiments, the auto-focus mechanism 206 may be used to provide only mechanical, or only digital, focus adjustments.

Figure 3:
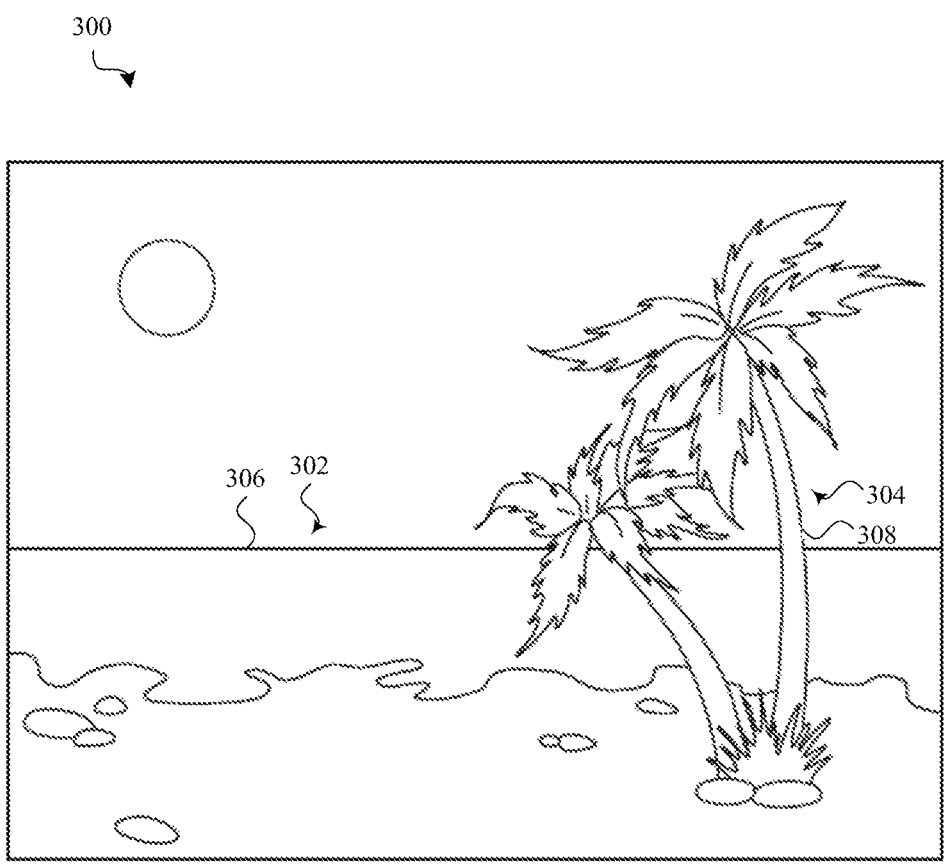
FIG. 3 shows an example of an image that may be captured by an image capture device.

Referring now to FIG. 3, there is shown an example of an image 300 that may be captured by an image capture device, such as one of the cameras described with reference to FIG. 1A-1B or 2. The image 300 may include a number of objects 302, 304 having edges 306, 308 oriented in one or more directions. The edges 306, 308 may include perceptible edges between objects, or edges defined by different colors or brightness levels (e.g., an edge between dark and light regions). In some embodiments, the camera may only detect a focus of one set of edges (e.g., only horizontal edges or only vertical edges). In some embodiments, the camera may detect a focus of both a first set of edges (e.g., horizontal edges) and a second set of edges (e.g., vertical edges, or edges that are orthogonal to the first set of edges).

The focus of the first and/or second sets of edges may be detected in the same or different image capture frames, using the same or different pixels. In some cases, a focus of edges in the first set of edges may be detected using a first subset of pixels configured to detect a focus of horizontal edges, in a same frame that a focus of edges in the second set of edges is detected by a second subset of pixels configured to detect a focus of vertical edges. A focus of edges may be detected based on a phase difference (e.g., magnitude and polarity of the phase difference) in light captured by different photodetectors in a pair of photodetectors associated with a pixel.

In some embodiments, a single pixel in a pixel array (and in some cases, some or each of the pixels in the pixel array, or each of the pixels in a subset of pixels in the pixel array) may be configured to produce a signal usable for detecting the focus of a horizontal edge or a vertical edge. In some embodiments, all of the pixels in a pixel array (or all of the pixels used to capture a particular image) may be employed in the detection of edge focus information for an image.

Figure 4:
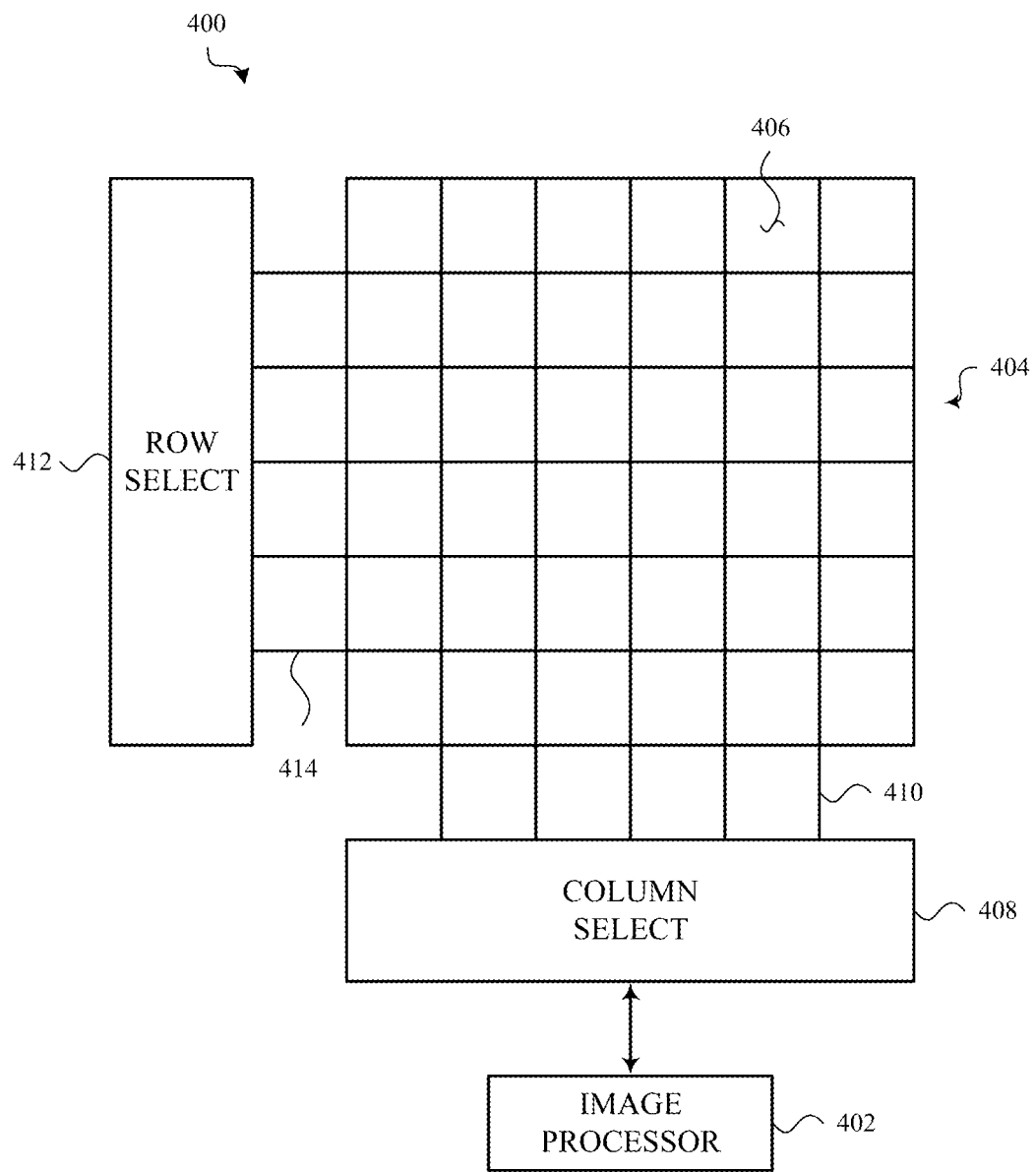
FIG. 4 shows a block diagram of one example of an image sensor.

FIG. 4 shows a block diagram of one example of an image sensor 400, such as an image sensor associated with one of the image capture devices or cameras described with reference to FIGS. 1A-1B and 2. The image sensor 400 may include an image processor 402 and an imaging area 404. The imaging area 404 may be implemented as a pixel array that includes a plurality of pixels 406. The pixels 406 may be same colored pixels (e.g., for a monochrome imaging area 404) or differently colored pixels (e.g., for a multi-color imaging area 404). In the illustrated embodiment, the pixels 406 are arranged in rows and columns. However, other embodiments are not limited to this configuration. The pixels in a pixel array may be arranged in any suitable configuration, such as, for example, a hexagonal configuration.

The imaging area 404 may be in communication with a column select circuit 408 through one or more column select lines 410, and with a row select circuit 412 through one or more row select lines 414. The row select circuit 412 may selectively activate a particular pixel 406 or group of pixels, such as all of the pixels 406 in a particular row. The column select circuit 408 may selectively receive the data output from a selected pixel 406 or group of pixels 406 (e.g., all of the pixels in a particular row).

The row select circuit 412 and/or column select circuit 408 may be in communication with an image processor 402. The image processor 402 may process data from the pixels 406 and provide that data to another processor (e.g., a system processor) and/or other components of a device (e.g., other components of the electronic device 100). In some embodiments, the image processor 402 may be incorporated into the system. The image processor 402 may also receive focus information (e.g., PDAF information) from some or all of the pixels, and may perform a focusing operation for the image sensor 400. In some examples, the image processor 402 may perform one or more of the operations performed by the auto-focus mechanism described with reference to FIG. 2.

Figure 5A:
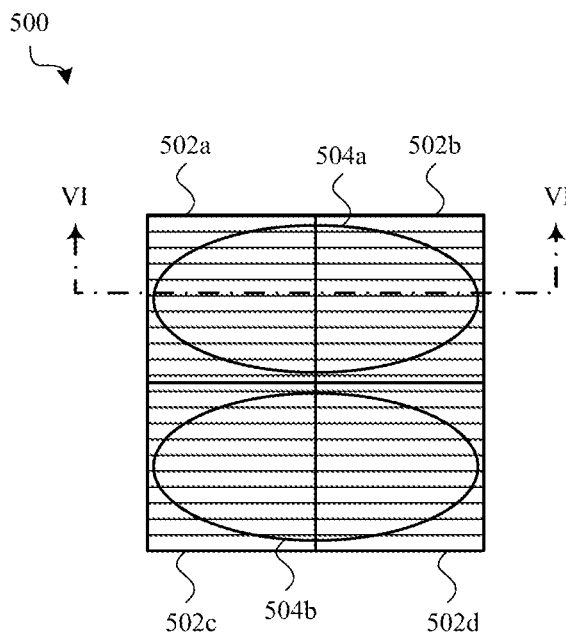
FIGS. 5A, 5B, and 5C show example arrays of pixels (e.g., plan views) in an image capture device.

FIG. 5A shows an example array of pixels 500 in an image capture device, as may be included in a portion of an image sensor associated with one of the image capture devices or cameras described with reference to FIGS. 1A-1B and 2, or in a pixel included in the image sensor described with reference to FIG. 4. In some embodiments, some 2×2 subsets of pixels in an image sensor, or each 2×2 subset of pixels in an image sensor, may be configured as shown in FIG. 5A.

Each pixel in the 2×2 subset of pixels 500 includes a respective photodetector 502a, 502b, 502c, or 502d. Each pixel may also include associated reset, control, and readout circuitry. In some embodiments, the photodetectors 502a, 502b, 502c, 502d may be arranged in two rows and two columns. For example, the array may include a first photodetector 502a and a second photodetector 502b arranged in a first row, and a third photodetector 502c and a fourth photodetector 502d arranged in a second row. The first photodetector 502a and the third photodetector 502c may be arranged in a first column, and the second photodetector 502b and the fourth photodetector 502d may be arranged in a second column.

Each photodetector 502 may be electrically isolated from each other photodetector 502 (e.g., by implant isolation or physical trench isolation). A first 2×1 OCL 504a may be disposed over two of the photodetectors or pixels (e.g., over the first photodetector 502a and the second photodetector 502b). A second 2×1 OCL 504b may be disposed over the remaining two of the photodetectors or pixels (e.g., over the third photodetector 502c and the fourth photodetector 502d).

An optional single-piece or multi-piece filter element (e.g., a red filter, a blue filter, a green filter, or the like) may be disposed over the array of photodetectors 502 or pixels (e.g., over the first photodetector 502a, the second photodetector 502b, the third photodetector 502c, and the fourth photodetector 502d). In some examples, the filter element may be applied to an interior or exterior of each 2×1 OCL 504a, 504b. In some examples, each OCL 504a, 504b may be tinted to provide the filter element. In some examples, each of the photodetectors may be separately encapsulated under the OCLs 504a, 504b, and the filter element may be applied to or in the encapsulant. In some examples, a filter element may be positioned between the array of photodetectors 502 and the OCLs 504a, 504b (although other configurations of the filter element may also be considered as being disposed "between" the photodetectors 502 and the OCLs 504a, 504b).

The photodetectors 502 may be connected to a shared readout circuit (i.e., a readout circuit shared by all of the photodetectors 502 associated with the pixel 500). A set of charge transfer transistors may be operable to connect the photodetectors 502 to the shared readout circuit (e.g., each charge transfer transistor in the set may be operable (e.g., by a processor) to connect a respective one of the photodetectors 502 to, and disconnect the respective one of the photodetectors 502 from, the shared readout circuit; alternatively, a charge transfer transistor may be statically configured to connect/disconnect a pair of the photodetectors 502 (e.g., a pair of photodetectors 502 under a common 2×1 OCL, or a pair of photodetectors 502 that are disposed along a direction that is orthogonal to each of the first and second OCLs 504a, 504b, to/from the shared readout circuit). In some cases, each charge transfer transistor may be operated individually. In other cases, the charge transfer transistors may be statically configured for pair-wise operation.

Figure 5B:
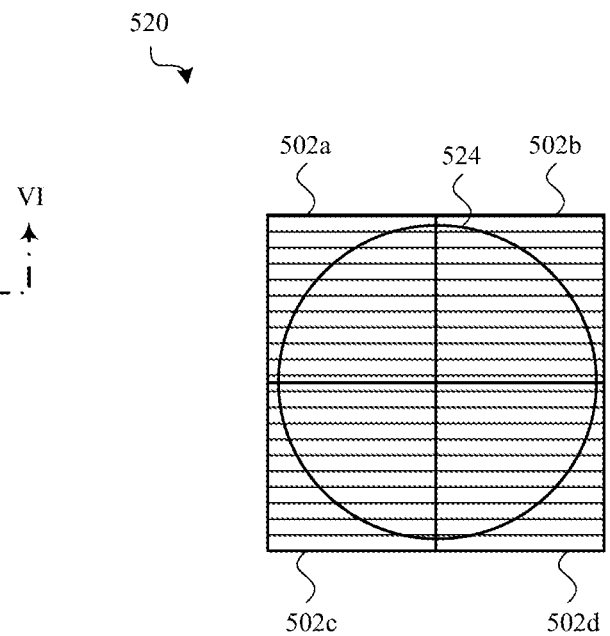

FIG. 5B shows another example array of pixels 520 in an image capture device, as may be included in a portion of an image sensor associated with one of the image capture devices or cameras described with reference to FIGS. 1A-1B and 2, or in a pixel included in the image sensor described with reference to FIG. 4. In some embodiments, some 2×2 subsets of pixels in an image sensor, or each 2×2 subset of pixels in an image sensor, may be configured as shown in FIG. 5B.

Each pixel in the 2×2 subset of pixels 520 includes a respective photodetector 502a, 502b, 502c, or 502d, as described with reference to FIG. 5A.

A 2×2 OCL 524 may be disposed over the photodetectors or pixels (e.g., over the first photodetector 502a, the second photodetector 502b, the third photodetector 502c, and the fourth photodetector 502d).

Figure 5C:
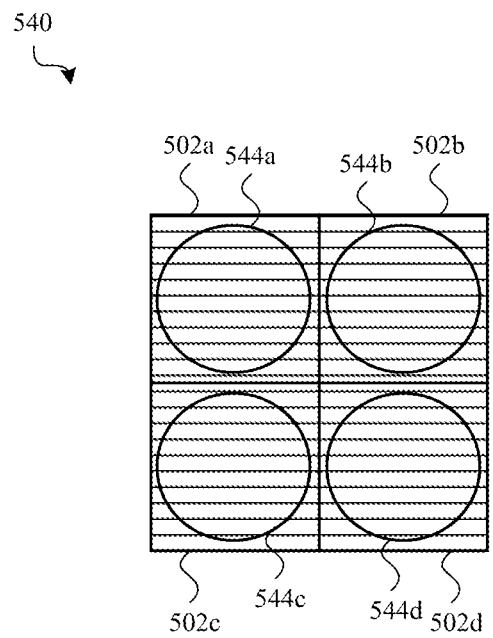

FIG. 5C shows another example array of pixels 540 in an image capture device, as may be included in a portion of an image sensor associated with one of the image capture devices or cameras described with reference to FIGS. 1A-1B and 2, or in a pixel included in the image sensor described with reference to FIG. 4. In some embodiments, some 2×2 subsets of pixels in an image sensor, or each 2×2 subset of pixels in an image sensor, may be configured as shown in FIG. 5B.

Each pixel in the 2×2 subset of pixels 540 includes a respective photodetector 502a, 502b, 502c, or 502d, as described with reference to FIG. 5A.

A different 1×1 OCL 544a, 544b, 544c, or 544d may be disposed over the photodetectors or pixels (e.g., a first 1×1 OCL 544a may be disposed over the first photodetector 502a, a second 1×1 OCL 544b may be disposed over the second photodetector 502b, a third 1×1 OCL 544c may be disposed over the third photodetector 502c, and a fourth 1×1 OCL 544d may be disposed over the fourth photodetector 502d).

Figure 6:
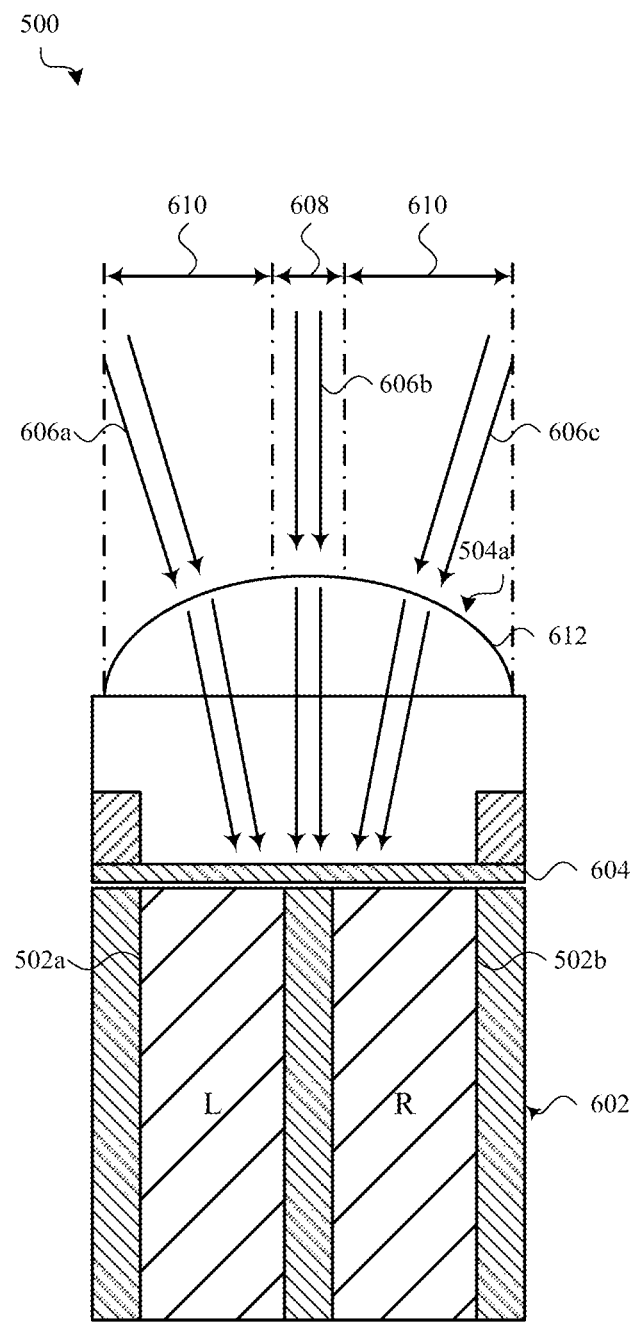
FIG. 6 shows an example cross-section of the array of pixels shown in FIG. 5A.

FIG. 6 shows an example cross-section of the array of pixels 500 shown in FIG. 5A. By way of example, the cross-section is taken along line VI-VI, through the first row of photodetectors 502a, 50b shown in FIG. 5A. A cross-section taken through the second row of photodetectors 502c, 502d shown in FIG. 5A (not shown) may be configured similarly to the cross-section shown in FIG. 6.

The first and second photodetectors 502a, 502b may be formed in a substrate 602. The substrate 602 may include a semiconductor-based material, such as, but not limited to, silicon, silicon-on-insulator (SOI), silicon-on-sapphire (SOS), doped and undoped semiconductor regions, epitaxial layers formed on a semiconductor substrate, well regions or buried layers formed in a semiconductor substrate, or other semiconductor structures.

The 2×1 OCL 504a may be disposed over part or all of both of the photodetectors 502a and 502b. The OCL 504a may be formed of any material or combination of materials that is translucent to at least one wavelength of light. The OCL 504a may have a light-receiving side 612 opposite the array of photodetectors 502. The light-receiving side 612 of the OCL 504a may include a central portion 608 and a peripheral portion 610. The peripheral portion 610 may be configured to redirect at least a portion of light incident on the peripheral portion (e.g., the light 606a or light 606c) toward a corresponding peripheral portion of the imaging area that includes the photodetectors 502 (e.g., the light 606a may be redirected toward the photodetector 502a, and the light 606c may be redirected toward the photodetector 502b). In some embodiments, the OCL 504a may have a convex-shaped or dome-shaped light-receiving surface (or exterior surface).

The OCL 504a may be configured to focus incident light 606 received from different angles on different ones or both of the photodetectors 502a, 502b. For example, light 606a incident on the OCL 504a from a left side approach angle may be focused more (or solely) on the left side photodetector 502a, and thus the left side photodetector 502a may accumulate more charge than the right side photodetector 502b, making the signal response of the left side photodetector 502a greater than the signal response of the right side photodetector 502b. Similarly, light 606c incident on the OCL 504a from a right side approach angle may be focused more (or solely) on the right side photodetector 502b, and thus the right side photodetector 502b may accumulate more charge than the left side photodetector 502a, making the signal response of the right side photodetector 502b greater than the signal response of the left side photodetector 502a. Light 606b incident on the OCL 504a from the front center (or top) of the OCL 504a may be focused on both of the photodetectors 502a, 502b, making the signal response of the left and right side photodetectors 502a, 502b about equal.

An optional same color filter element 604 (e.g., a red filter, a blue filter, a green filter, or the like) may be disposed over each (or both) of the photodetectors 502a, 502b (as well as the photodetectors 502c and 502d, not shown).

Figure 7:
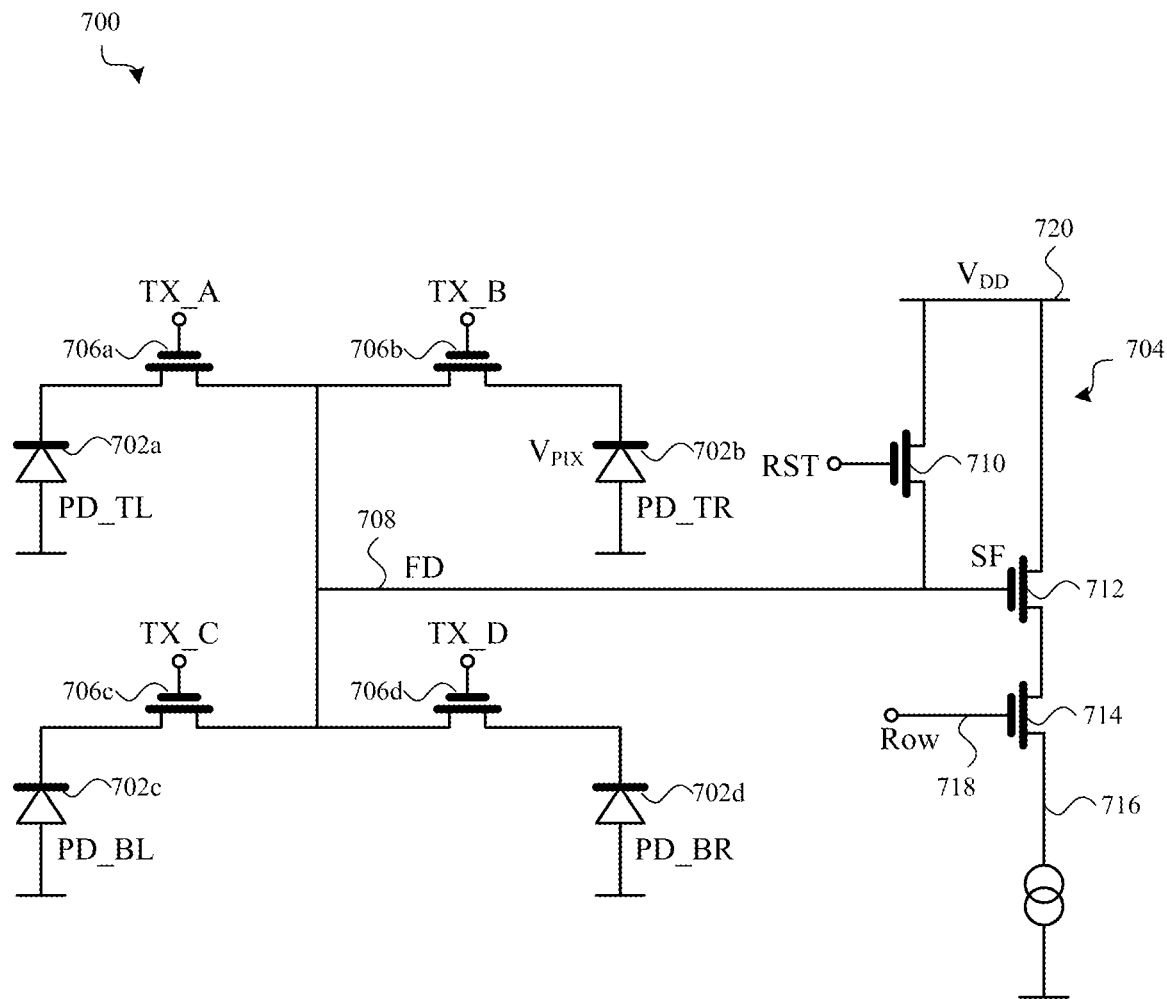
FIG. 7 shows a simplified schematic of an example array of pixels.

Referring now to FIG. 7, there is shown a simplified schematic of an example array of pixels 700 (and associated shared readout circuit 704). In some embodiments, the array of pixels 700 may be an example array of pixels included in an image sensor associated with one of the image capture devices or cameras described with reference to FIGS. 1A-1B and 2, or an array of pixels included in the image sensor described with reference to FIG. 4, or the array of pixels described with reference to FIGS. 5A-6. In some embodiments, some 2×2 subsets of pixels in an image sensor, or each 2×2 subset of pixels in an image sensor, may be configured as shown in FIG. 7, and the shared readout circuit 704 for the pixel 700 may be part of an overall pixel readout circuit for an image sensor.

The array of pixels 700 may include a two-dimensional array of photodetectors 702, with each photodetector 702 being selectively connectable to (and disconnectable from) the shared readout circuit 704 by a respective charge transfer transistor in a set of charge transfer transistors 706. In some embodiments, the two-dimensional array of photodetectors 702 may include a 2×2 array of photodetectors (e.g., an array of photodetectors 702 arranged in two rows and two columns). For example, the array may include a first photodetector 702a (PD_TL) and a second photodetector 702b (PD_TR) arranged in a first row, and a third photodetector 702c (PD_BL) and a fourth photodetector 702d (PD_BR) arranged in a second row. The first photodetector 702a and the third photodetector 702c may be arranged in a first column, and the second photodetector 702*b* and the fourth photodetector 702*d* may be arranged in a second column. As described with reference to FIGS. 5 and 6, the photodetectors 702 may be disposed (positioned) in a 2×2 array under a pair of adjacent 2×1 OCLs.

The shared readout circuit 704 may include a sense region 708, a reset (RST) transistor 710, a readout transistor 712, and a row select (RS) transistor 714. The sense region 708 may include a capacitor that temporarily stores charge received from one or more of the photodetectors 702. As described below, charge accumulated by one or more of the photodetectors 702 may be transferred to the sense region 708 by applying a drive signal (e.g., a gate voltage) to one or more of the charge transfer transistors 706. The transferred charge may be stored in the sense region 708 until a drive signal applied to the reset (RST) transistor 710 is pulsed.

Each of the charge transfer transistors 706 may have one terminal connected to a respective one of the photodetectors 702 and another terminal connected to the sense region 708. One terminal of the reset transistor 710 and one terminal of the readout transistor 712 may be connected to a supply voltage (e.g., VDD) 720. The other terminal of the reset transistor 710 may be connected to the sense region 708, while the other terminal of the readout transistor 712 may be connected to a terminal of the row select transistor 714. The other terminal of the row select transistor 714 may be connected to an output line 716.

By way of example only, and in one embodiment, each of the photodetectors 702 may be implemented as a photodiode (PD) or pinned photodiode, the sense region 708 may be implemented as a floating diffusion (FD) node, and the readout transistor 712 may be implemented as a source follower (SF) transistor. The photodetectors 702 may be electron-based photodiodes or hole-based photodiodes. The term photodetector is used herein to refer to substantially any type of photon or light detecting component, such as a photodiode, pinned photodiode, photogate, or other photon sensitive region. Additionally, the term sense region, as used herein, is meant to encompass substantially any type of charge storing or charge converting region.

In some embodiments, the array of pixels 700 may be implemented using additional or different components. For example, the row select transistor 714 may be omitted and a pulsed power supply may be used to select the array of pixels.

When an image is to be captured, an integration period for the array of pixels begins and the photodetectors 702 accumulate photo-generated charge in response to incident light. When the integration period ends, the accumulated charge in some or all of the photodetectors 702 may be transferred to the sense region 708 by sequentially or simultaneously applying drive signals to (e.g., by pulsing gate voltages of) the charge transfer transistors 706. Typically, the reset transistor 710 is used to reset the voltage on the sense region 708 to a predetermined level prior to the transfer of charge from a set of one or more photodetectors 702 to the sense region 708. When charge is to be read out for the array of pixels 700, a drive signal may be applied to the row select transistor 714 (e.g., a gate voltage of the row select transistor 714 may be pulsed) via a row select line 718 coupled to row select circuitry, and charge from one, two, or any number of the photodetectors 702 may be read out over an output line 716 coupled to column select circuitry. The readout transistor 712 senses the voltage on the sense region 708, and the row select transistor 714 transfers an indication of the voltage to the output line 716. The column select circuitry may be coupled to an image processor, auto-focus mechanism, or combination thereof.

In some embodiments, a processor may be configured to operate the set of charge transfer transistors 706 to simultaneously transfer charge from multiple photodetectors 702 (e.g., a pair of photodetectors) to the sense region 708 or floating diffusion node. For example, the gates of first and second charge transfer transistors 706*a* (TX_A) and 706*b* (TX_B) (i.e., the charge transfer transistors of the first row) may be simultaneously driven to transfer charges accumulated by the first and second photodetectors 702*a*, 702*b* to the sense region 708, where the charges may be summed. After reading the summed charge out of the array of pixels 700, the gates of third and fourth charge transfer transistors 706*c* (TX_C) and 706*d* (TX_D) (i.e., the charge transfer transistors of the second row) may be simultaneously driven to transfer charges accumulated by the third and fourth photodetectors 702*c*, 702*d* to the sense region 708, where the charges may be summed. This summed charge may also be read out of the array of pixels 700. In a subsequent frame of image capture, the gates of the first and third charge transfer transistors 706*a* and 706*c* (i.e., the charge transfer transistors of the first column) may be simultaneously driven to transfer charges accumulated by the first and third photodetectors 702*a*, 702*c* to the sense region 708. After reading this charge out of the array of pixels 700, the gates of the second and fourth charge transfer transistors 706*b* and 706*d* (i.e., the charge transfer transistors of the second column) may be simultaneously driven to transfer charges accumulated by the second and fourth photodetectors 702*b*, 702*d* to the sense region 708. This charge may also be read out of the array of pixels 700. Additionally or alternatively, charge accumulated by the photodetectors 702 may be read out of the array of pixels 700 individually, or charges accumulated by any combination (including all) of the photodetectors 702 may be read out of the array of pixels 700 together, or charges accumulated by the photodetectors 702 along a left- or right-sloping diagonal may be read out of the array of pixels 700 together.

When charges accumulated by different photodetectors 702 are read out of the array of pixels 700 individually, the charges may be summed in various ways, or a processor may interpolate between the values read out of the photodetectors in different pixels of a pixel array (e.g., perform a de-mosaicing operation) to generate an image having an effective 4× resolution for the pixel array.

In some embodiments, a shared readout circuit may be configured differently for different subsets of pixels in a pixel array. For example, in a potentially lower cost image sensor, or in an image sensor implemented using front side illumination (FSI) technology, a single charge transfer transistor may be coupled to a pair of photodetectors, and may be operated by a processor to simultaneously read charges out of, and sum charges, integrated by a pair of photodetectors. For example, in one subset of pixels of an image sensor, a single charge transfer transistor could replace both of the charge transfer transistors 706*a* and 706*b* and connect both of the photodetectors 702*a* and 702*b* to the shared readout circuit 704, and another charge transfer transistor could replace both of the charge transfer transistors 706*c* and 706*d* and connect both of the photodetectors 702*c* and 702*d* to the shared readout circuit 704. Similarly, in another subset of pixels of the image sensor, a single charge transfer transistor could replace both of the charge transfer transistors 706*a* and 706*c* and connect both of the photodetectors 702*a* and 702*c* to the shared readout circuit 704, and another charge transfer transistor could replace both of the charge transfer transistors 706b and 706d and connect both of the photodetectors 702b and 702d to the shared readout circuit 704.

In some embodiments, an image capture device, such as a camera, may not include a shutter, and thus an image sensor of the image capture device may be constantly exposed to light. When the array of pixels 700 is used in these embodiments, the photodetectors 702 may have to be reset or depleted of charge before an image is captured (e.g., by applying drive signals (e.g., gate voltages) to the reset transistor 710 and charge transfer transistors 706). After the charge from the photodetectors 702 has been depleted, the charge transfer transistors 706 and reset transistor 710 may be turned off to isolate the photodetectors 702 from the shared readout circuit 704. The photodetectors 702 can then accumulate photon-generated charge during a charge integration period.

Figure 8A:
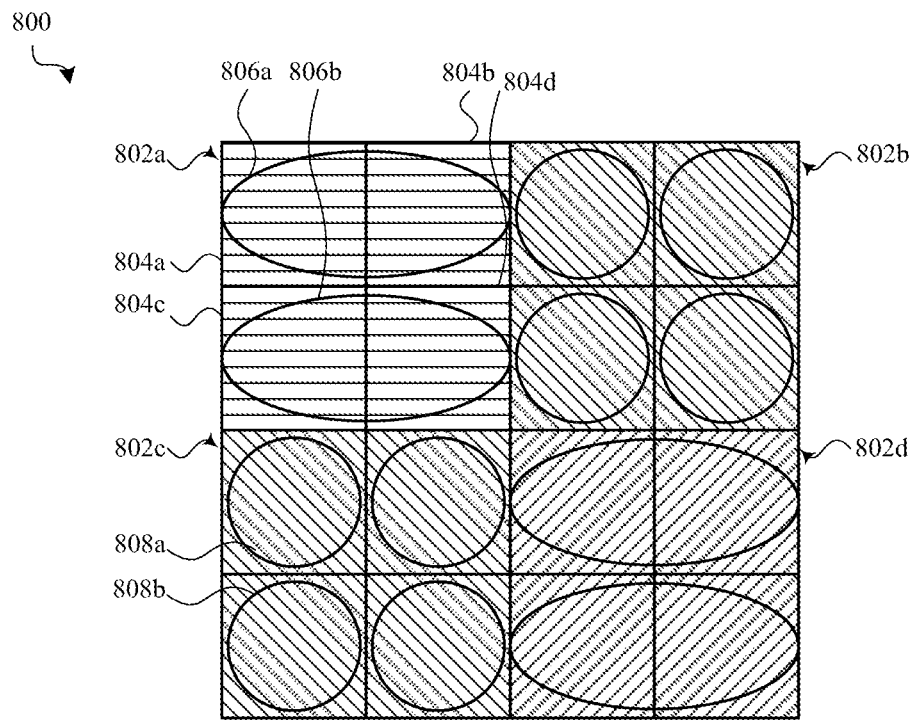
FIGS. 8A and 8B show example arrays of pixels.
Figure 8B:
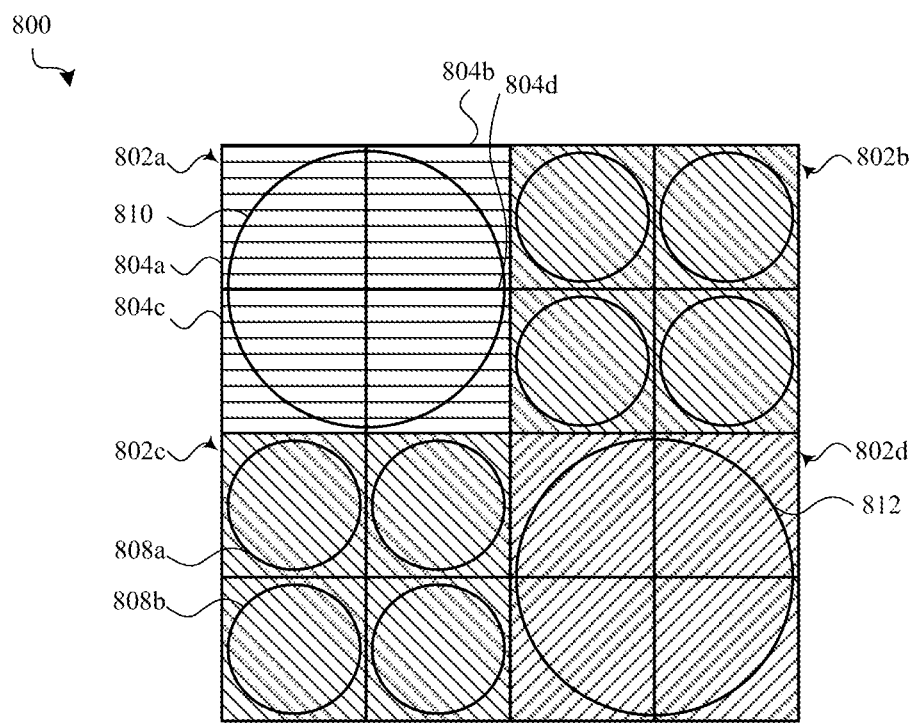
Figure 8B:
Figure 8B:
Figure 8B:

FIGS. 8A and 8B each show an array of pixels 800 (e.g., a 4×4 array of pixels). In some cases, the array of pixels 800 may represent a portion of a much larger array of pixels, such as an array of millions of pixels included in an image sensor. In some cases, the array of pixels 800 may be included in an image sensor associated with one of the image capture devices or cameras described with reference to FIGS. 1A-1B and 2, or a set of pixels included in the image sensor described with reference to FIG. 4. In some cases, each 2×2 subset of pixels 802 (or quadrant of pixels) in the array of pixels 800 may be configured similarly to the array of pixels described with reference to FIGS. 5A-6 and, in some cases, each 2×2 subset of pixels 802 may be associated with an instance of the shared readout circuit described with reference to FIG. 7.

By way of example, the array of pixels 800 includes a red subset of pixels 802a, first and second green subsets of pixels 802b, 802c, and a blue subset of pixels 802d arranged in a Bayer pattern. The Bayer pattern may be achieved by disposing a color filter array over the array of pixels 800. For example, different subsets of filter elements in the color filter array may be disposed over different subsets of pixels in the array of pixels 800, with each subset of filter elements having a different color (e.g., red filter elements, green filter elements, or blue filter elements). In alternative embodiments, the different subsets of filter elements may be associated with different colors (e.g., cyan, yellow, and magenta filter elements; cyan, yellow, green, and magenta filter elements; red, green, blue, and white filter elements; and so on). In some alternative embodiments, a color filter array may not be provided, or all of the filter elements in the color filter array may have the same color.

Each subset of pixels 802a, 802b, 802c, 802d may include a two-dimensional array of photodetectors 804. For example, each subset of pixels 802a, 802b, 802c, 802d may include a first photodetector 804a and a second photodetector 804b arranged in a first row, and a third photodetector 804c and a fourth photodetector 804d arranged in a second row. The first photodetector 804a and the third photodetector 804c may be arranged in a first column, and the second photodetector 804b and the fourth photodetector 804d may be arranged in a second column.

Each photodetector 804a, 804b, 804c, 804d may be electrically isolated from each other photodetector 804a, 804b, 804c, 804d (e.g., by implant isolation or physical trench isolation).

A set of 2×1 OCLs 806 may be disposed over each of the red and blue subsets of pixels 802a, 802d, with a pair of adjacent 2×1 OCLs 806a, 806b disposed over different subsets of pixels in the red and blue subsets of pixels 802a, 802d. As shown, the pair of adjacent OCLs 806 may include a first 2×1 OCL 806a disposed over two adjacent photodetectors 804 (e.g., over the first and second photodetectors 804a, 804b), and a second 2×1 OCL 806b disposed over two other adjacent photodetectors 804 (e.g., over the third and fourth photodetectors 804c, 804d).

A set of 1×1 OCLs 808 may be disposed over each green pixel (e.g., 804e, 804θ in the green subsets of pixels 802b, 802c.

The photodetectors 804a, 804b, 804c, 804d of a subset of pixels 802a, 802b, 802c, or 802d may be connected to a shared readout circuit (i.e., a readout circuit shared by all of the photodetectors associated with the subset of pixels, as described, for example, with reference to FIG. 7). A set of charge transfer transistors may be operable to connect the photodetectors 804a, 804b, 804c, 804d to the shared readout circuit (e.g., each charge transfer transistor in the set may be operable (e.g., by a processor) to connect a respective one of the photodetectors to, and disconnect the respective one of the photodetectors from, the shared readout circuit). In some cases, each charge transfer transistor may be operated individually. In some cases, pairs (or all) of the charge transfer transistors may be operated contemporaneously.

FIG. 8B shows an alternative to what is shown in FIG. 8A. In FIG. 8B, the 2×1 OCLs over the red and blue subsets of pixels 802a, 802d are replaced with 2×2 OCLs, with one 2×2 OCL 810 being placed over the red subset of pixels 802a, and one 2×2 OCL 812 being placed over the blue subset of pixels 802d.

The mixed sizes of OCLs shown in FIGS. 8A and 8B provide various advantages. For example, the 1×1 OCLs over each pixel in the green subsets of pixels 802b, 802c enables the capture of a high resolution green image with high signal-to-noise ratio (SNR). The 2×1 or 2×2 OCLs over the pixels in the red and blue subsets of pixels 802a, 802d enable the capture of good PDAF information. Overall, the arrays of pixels 800 described with reference to FIGS. 8A and 8B enables the capture of an image having a resolution and SNR approaching that of an image sensor having 1×1 OCLs over each pixel, with PDAF information approaching that which is available for an image sensor having 2×2 OCLs over each 2×2 subset of same-colored pixels.

FIGS. 9A-9E show an imaging area 900 of an image capture device (e.g., an image sensor), in which subsets of pixels 902 and color filters of the image capture device are arranged in accordance with a Bayer pattern (i.e., a 2×2 pattern including subsets of red pixels and blue pixels along one diagonal, and subsets of green pixels along the other diagonal). The subsets of pixels 902 may be arranged in Bayer pattern rows 906a, 906b and Bayer pattern columns 908a, 908b. More generally, the subsets of pixels 902 may be arranged in rows extending in a first dimension, and in columns extending in a second dimension orthogonal to the first dimension.

FIGS. 9A-9E show each subset of pixels 902 as having a 2×2 array of photodetectors 904, as described, for example, with reference to FIGS. 5-8B. In some embodiments, the imaging area 900 may be an example of an imaging area of an image sensor associated with one of the image capture devices or cameras described with reference to FIGS. 1A-1B and 2, or the imaging area of the image sensor described with reference to FIG. 4, or an imaging area including a plurality of the pixels described with reference to any of FIGS. 5A-8B.

A set of 2×1 or 2×2 OCLs 910 is disposed over the entirety of the red and blue subsets of pixels 902, and a set of 1×1 OCLs 912 is disposed over the entirety of the green subsets of pixels 902.

Figure 9A:
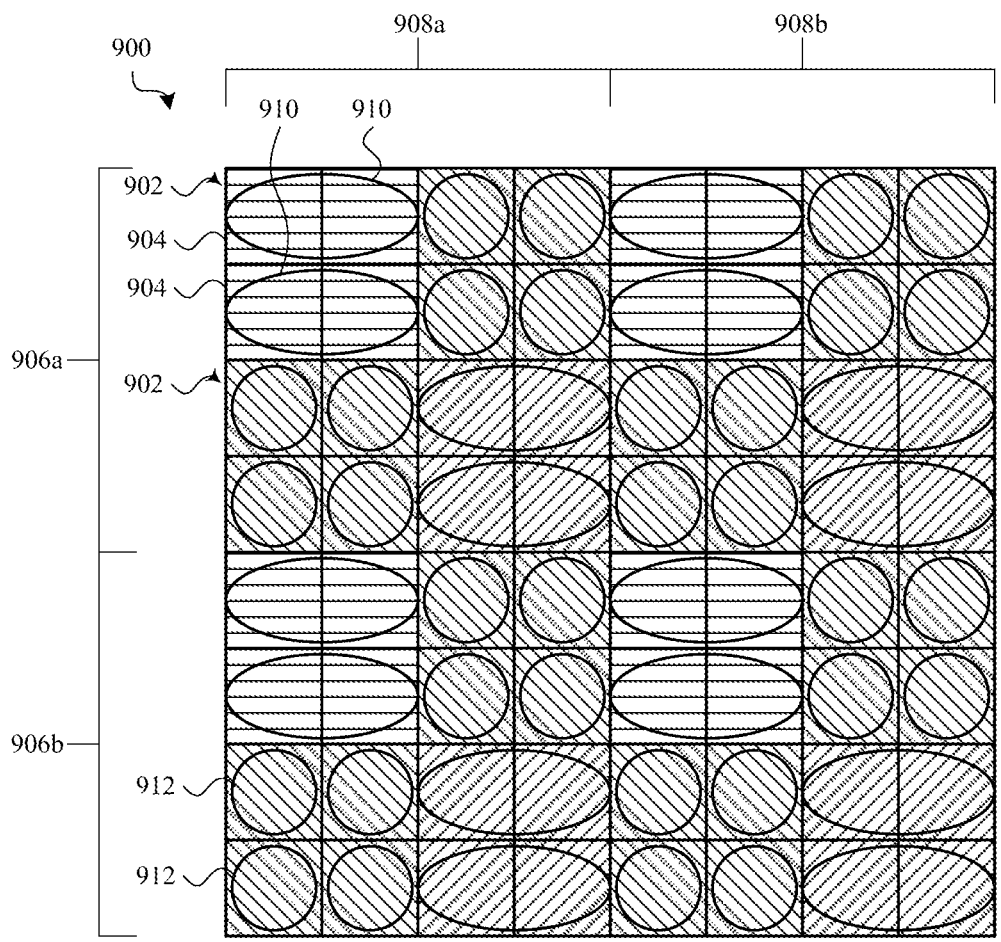
FIGS. 9A-9E show an imaging area of an image capture device, in which the pixels of the image capture device are disposed under a repeating Bayer pattern color filter (i.e., a 2×2 pattern including a red quadrant and a blue quadrant arranged along one diagonal, and green quadrants along the other diagonal)

In FIG. 9A, the subsets of red and blue pixels 902 in all of the Bayer pattern rows 906a, 906b of the imaging area 900 are configured (or are operable) to detect a phase difference (e.g., an out-of-focus condition) in a first set of edges of an image (e.g., vertical edges). Each 2×1 OCL 910 in the set of 2×1 OCLs 910 has a same orientation, with its longer dimension extending parallel to the Bayer pattern rows 906a, 906b.

Figure 9B:
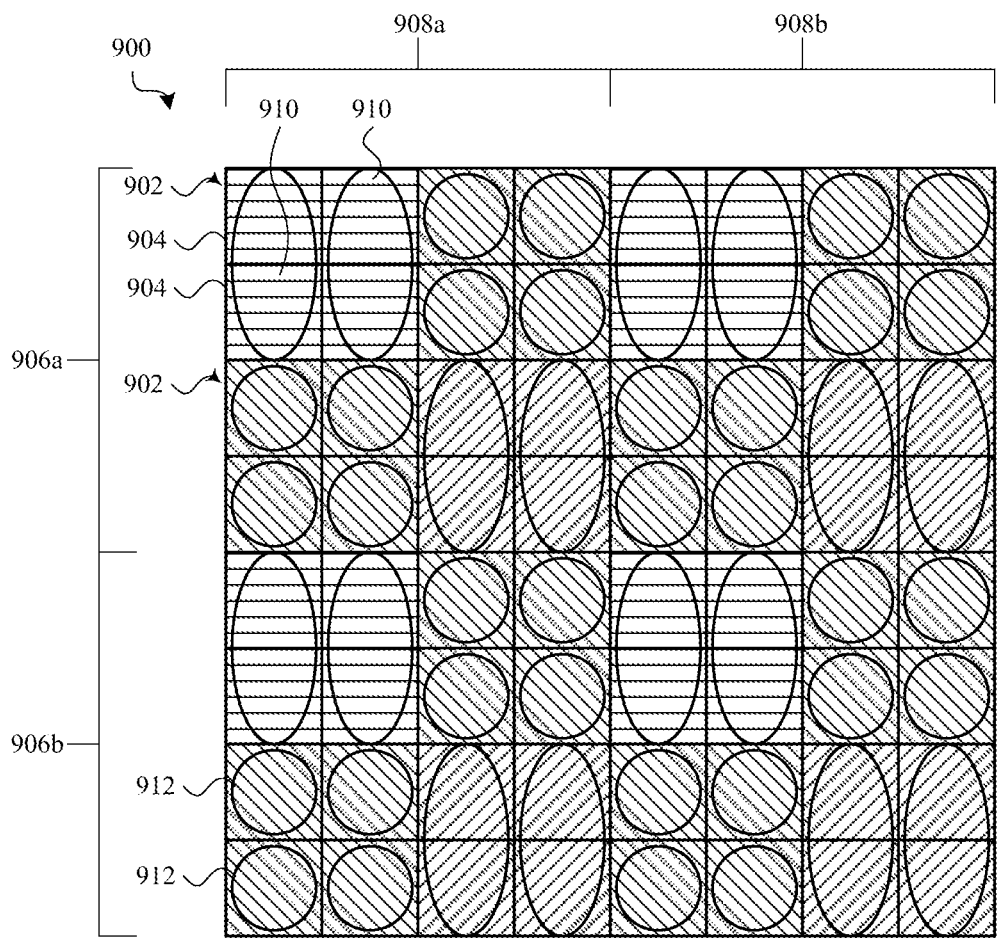

In FIG. 9B, the subsets of red and blue pixels 902 in all of the Bayer pattern columns 908a, 908b of the imaging area 900 are configured (or are operable) to detect a phase difference (e.g., an out-of-focus condition) in a second set of edges of an image (e.g., horizontal edges). Each 2×1 OCL 910 in the set of 2×1 OCLs 910 has a same orientation, with its longer dimension extending parallel to the Bayer pattern columns 908a, 908b.

Figure 9C:
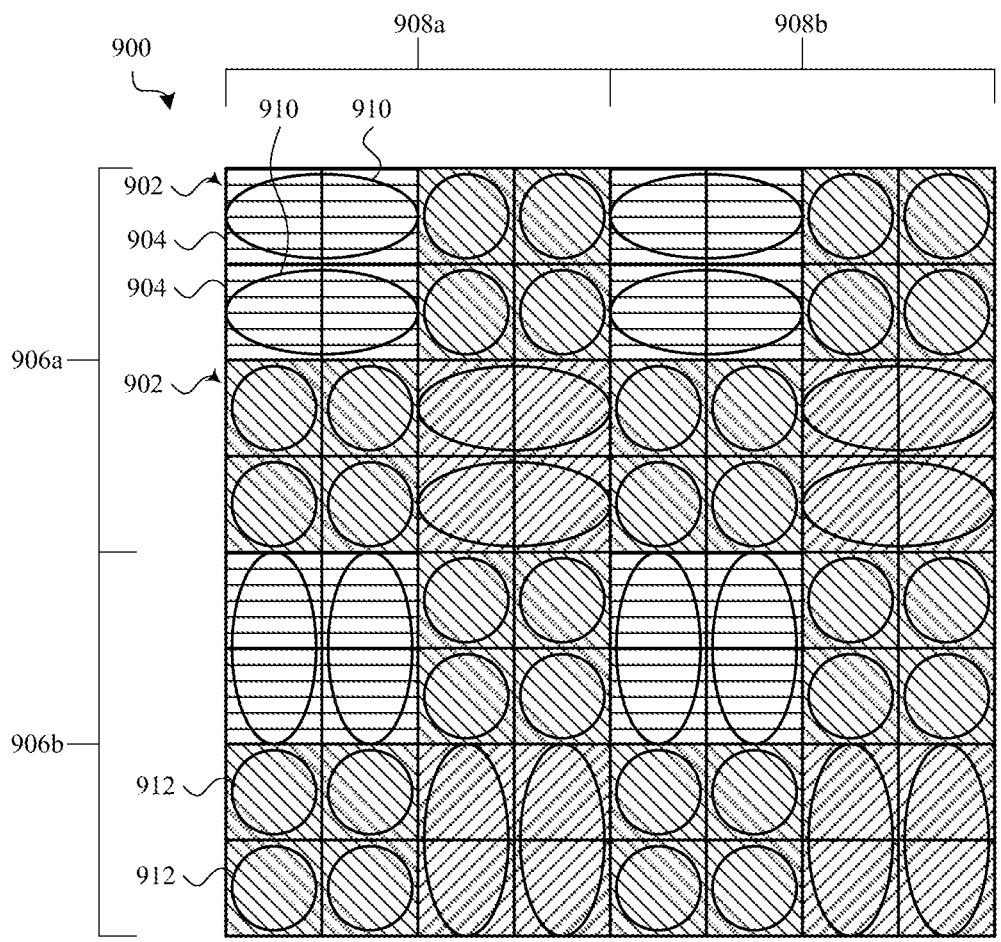

In FIG. 9C, the subsets of red and blue pixels 902 in the first Bayer pattern row 906a of the imaging area 900 are configured (or are operable) to detect a phase difference (e.g., an out-of-focus condition) in a first set of edges of an image (e.g., vertical edges), and the subsets of red and blue subsets of pixels 902 in the second Bayer pattern row 906b are configured (or are operable) to detect a phase difference in a second set of edges of the image (e.g., horizontal edges, or edges that are otherwise orthogonal to the first set of edges). The 2×1 OCLs 910 in the set of 2×1 OCLs 910 have different orientations, with a first subset of 2×1 OCLs 910 in the set of 2×1 OCLs 910 having a first orientation (e.g., with its longer dimension extending parallel to the Bayer pattern rows 906a, 906b), and a second subset of 2×1 OCLs 910 in the set of 2×1 OCLs 910 having a second orientation, orthogonal to the first orientation (e.g., with its longer dimension extending parallel to the Bayer pattern columns 908a, 908b). The first subset of 2×1 OCLs 910 may be disposed over a first set of rows of red and blue subsets of pixels 902 (e.g., over the Bayer pattern row 906a, or over interspersed rows (e.g., interspersed Bayer pattern rows 906) when the imaging area 900 includes more Bayer pattern rows than are shown). The second subset of 2×1 OCLs 910 may be disposed over a second set of rows of red and blue subsets of pixels 902 (e.g., over the Bayer pattern row 906b, or over interspersed rows (e.g., interspersed Bayer pattern rows 906) when the imaging area 900 includes more Bayer pattern rows than are shown). Alternatively, the first and second subsets of 2×1 OCLs 910 may be disposed over interspersed columns, such as interspersed Bayer pattern columns.

Figure 9D:
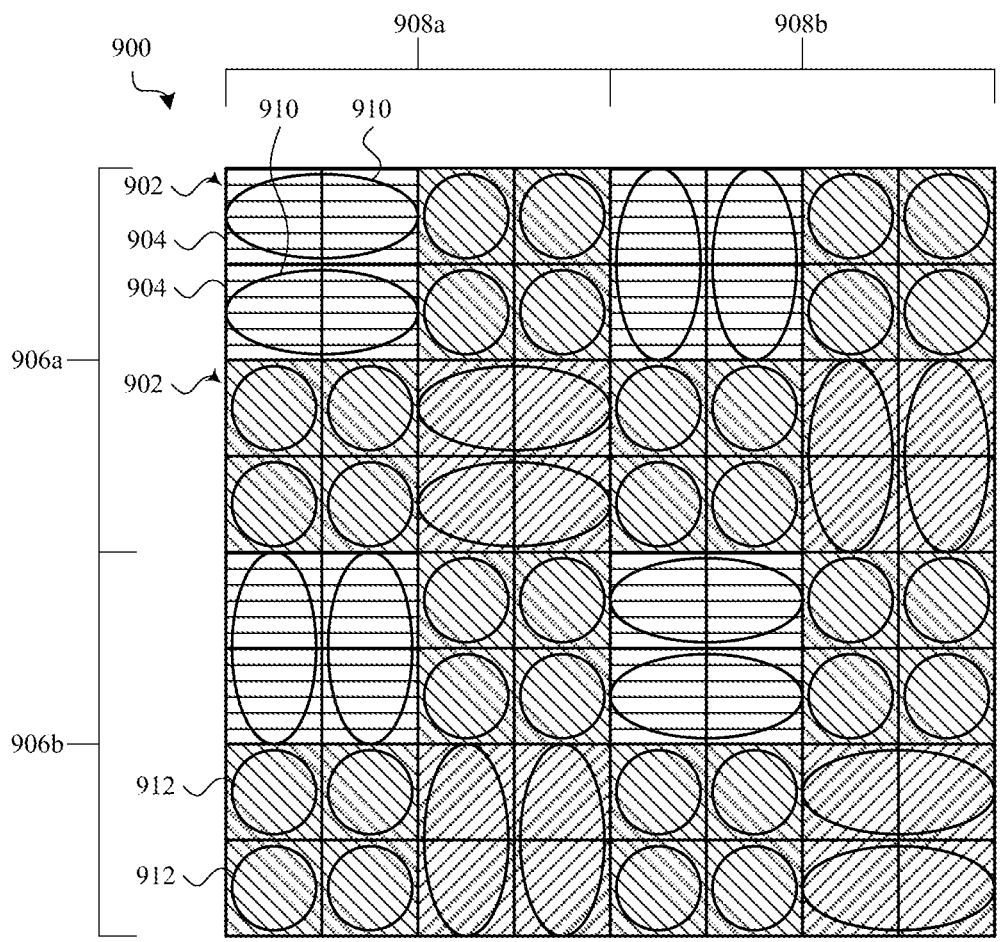

In FIG. 9D, the subsets of red and blue pixels 902 in a first lattice of pixels are configured (or are operable) to detect a phase difference (e.g., an out-of-focus condition) in a first set of edges of an image (e.g., vertical edges), and the subsets of red and blue pixels 902 in a second lattice of pixels are configured (or are operable) to detect a phase difference in a second set of edges of the image (e.g., horizontal edges, or edges that are otherwise orthogonal to the first set of edges). The lattices of pixels may be overlapping checkerboard lattices of pixels, or overlapping checkerboard lattices of Bayer pattern sets of pixels (e.g., each segment of each lattice may be a 2×2 array of pixels). The 2×1 OCLs 910 in the array of 2×1 OCLs 910 have different orientations, with a first subset of 2×1 OCLs 910 in the array of 2×1 OCLs 910 having a first orientation (e.g., with its longer dimension extending parallel to the Bayer pattern rows 906a, 906b), and a second subset of 2×1 OCLs 910 in the array of 2×1 OCLs 910 having a second orientation, orthogonal to the first orientation (e.g., with its longer dimension extending parallel to the Bayer pattern columns 908a, 908b). The first subset of 2×1 OCLs 910 may be disposed over the first lattice of red and blue subsets of pixels 902, and the second subset of 2×1 OCLs 910 may be disposed over the second lattice of red and blue subsets of pixels 902.

In the configuration shown in FIG. 9D, at least some of the 2×1 OCLs 910 in the first subset of 2×1 OCLs 910 and at least some of the 2×1 OCLs 910 in the second subset of 2×1 OCLs 910 are disposed over a subset of pixels disposed under a same-colored subset of filter elements. In this manner, PDAF information for detecting the focus of two orthogonal sets of edges may be collected from pixels 902 having the same color.

Figure 9E:
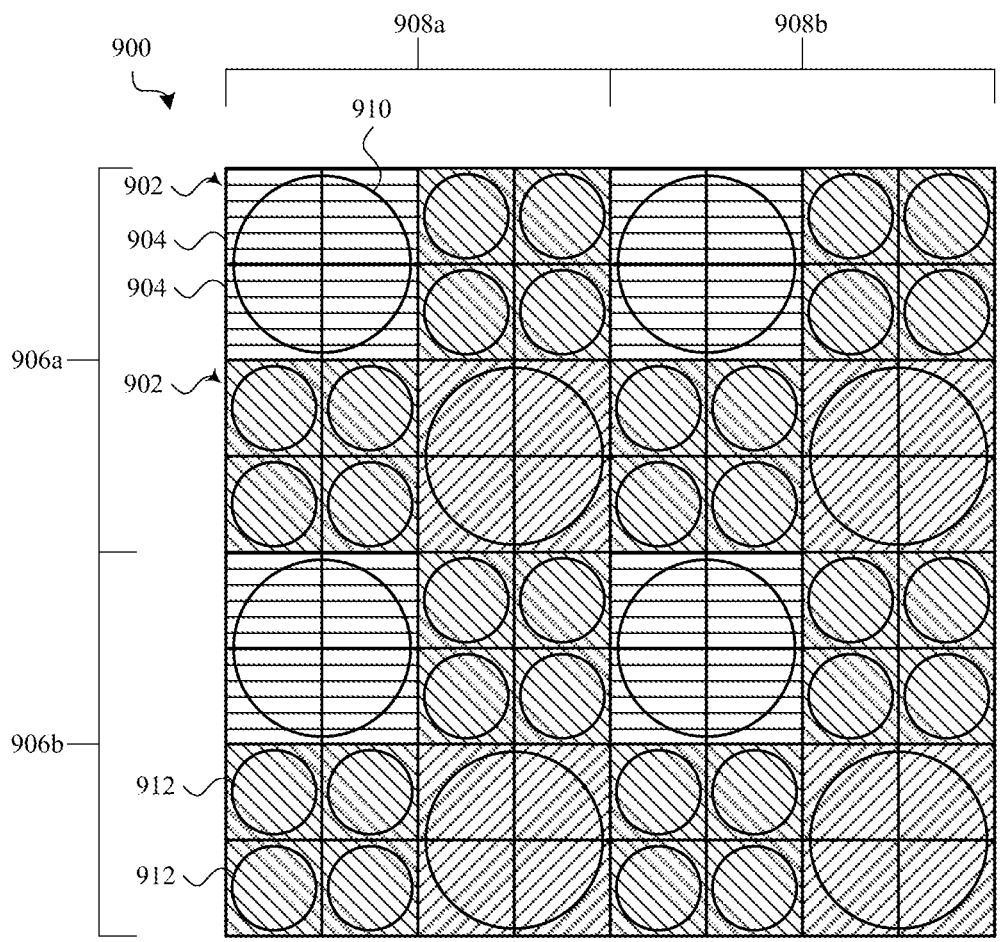

In FIG. 9E, the subsets of red and blue pixels 902 in all of the Bayer pattern rows 906a, 906b of the imaging area 900 are configured (or are operable) to detect a phase difference (e.g., an out-of-focus condition) in a first or second set of edges of an image (e.g., vertical or horizontal edges). A 2×2 OCL 910 is positioned over each subset of red and blue pixels 902.

Figure 10A:
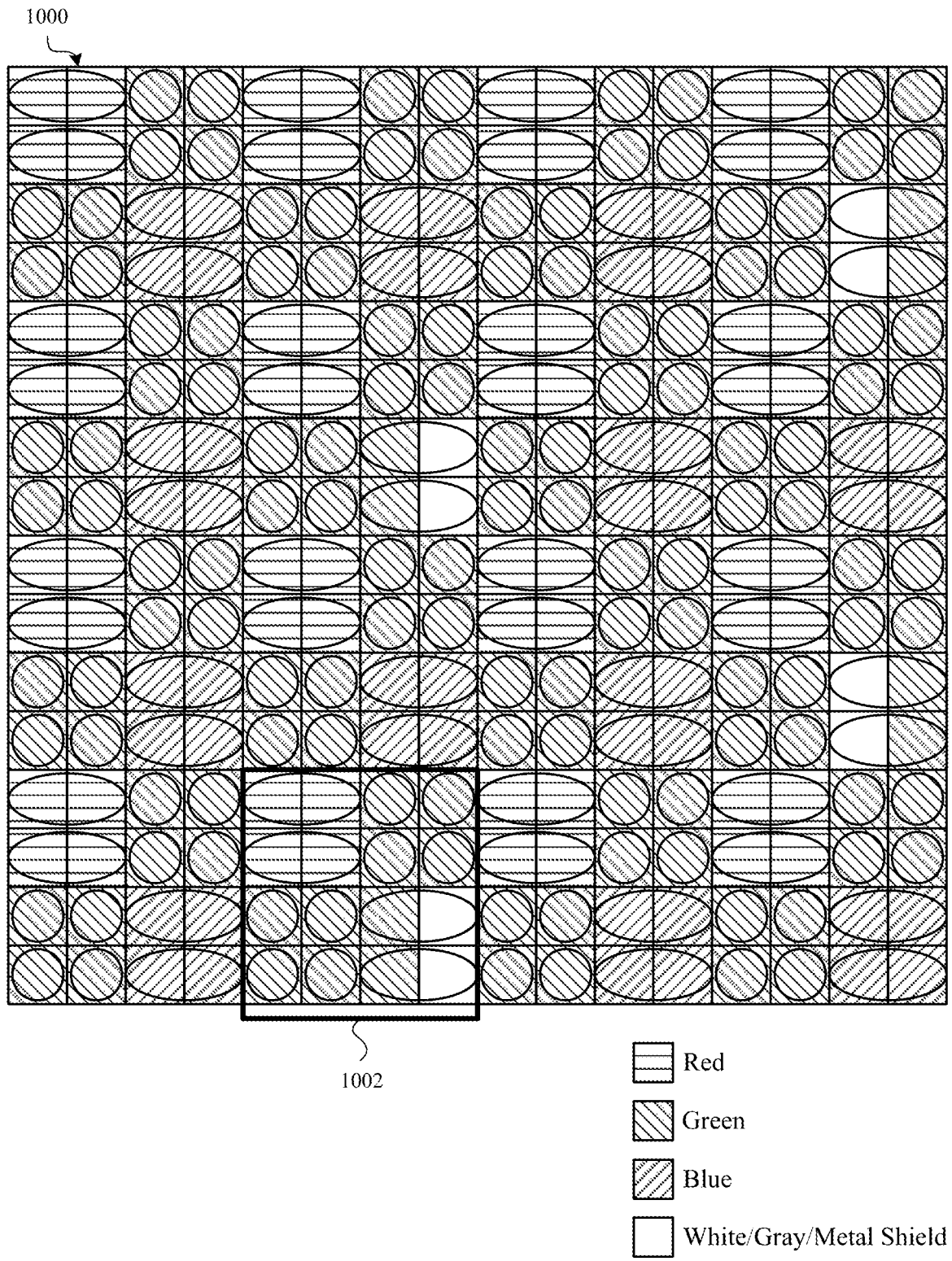
FIGS. 10A and 10B show further imaging areas of an image capture device.
Figure 10B:
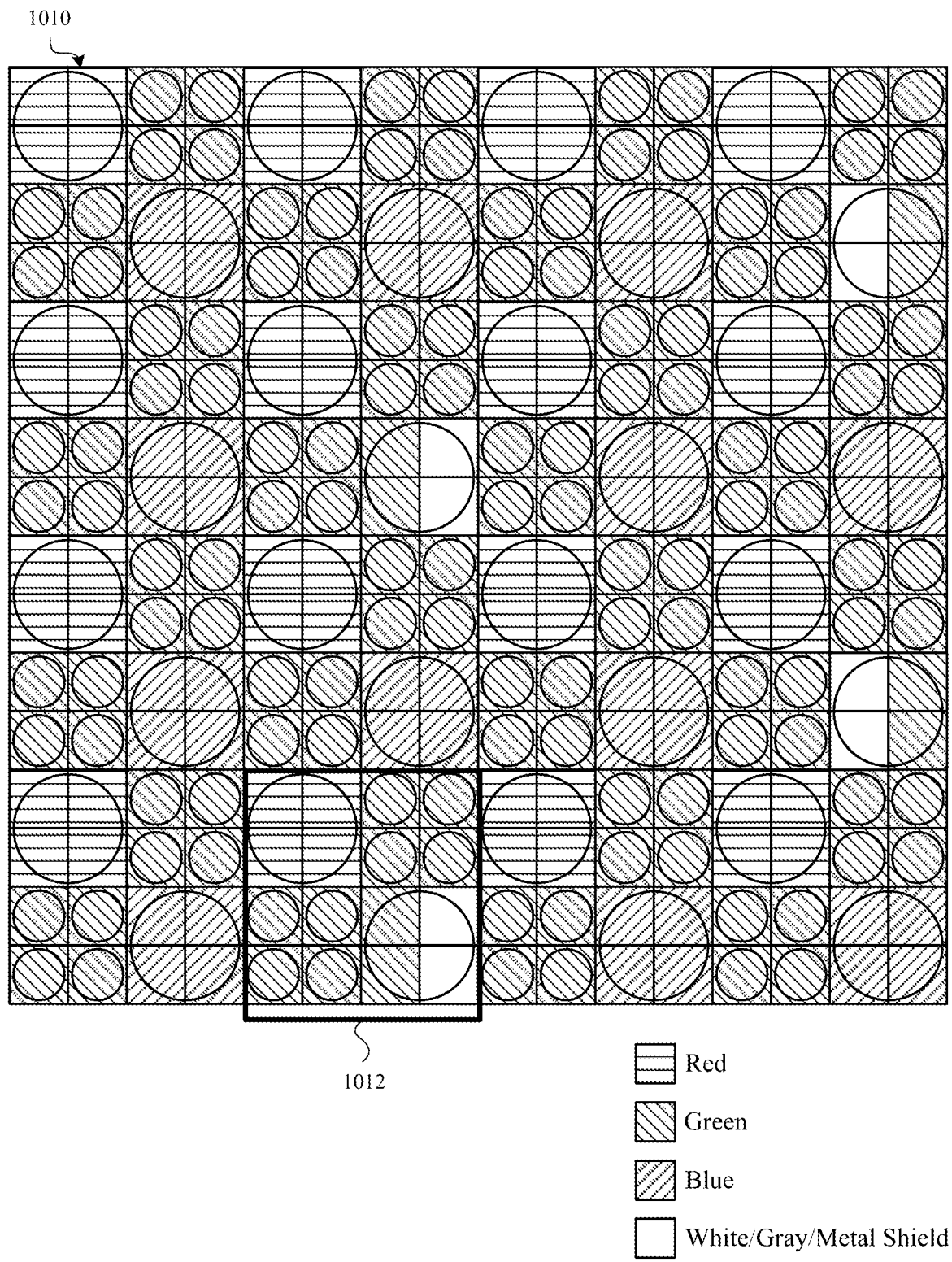

FIGS. 10A and 10B show imaging areas 1000, 1010 that include multiple instances of the imaging area shown in FIG. 9A. However, the imaging areas 1000, 1010 may alternatively include multiple instances of the imaging areas shown in any of FIGS. 9B-9E. Each of the imaging areas 1000, 1010 also includes multiple instances of an imaging area 1002 or 1012 that includes a 4×4 subset of pixels in which a color filter pattern disposed over the 4×4 subset of pixels defines a first 2×2 subset of pixels sensitive to red light; a second 2×2 subset of pixels sensitive to green light; a third 2×2 subset of pixels sensitive to green light; and a fourth 2×1 subset of pixels sensitive to green light. A set of 1×1 OCLs may include a different 1×1 OCL disposed over each pixel in the second 2×2 subset of pixels and the third 2×2 subset of pixels. A set of 2×1 OCLs or 2×2 OCLs may include a 2×1 OCL or a 2×2 OCL disposed over each pixel in the first 2×2 subset of pixels and the fourth 2×2 subset of pixels. A fifth 2×1 subset of pixels in the 4×4 subset of pixels may be covered by an opaque material, such as a metal grid. The fifth 2×1 subset of pixels may have a white, gray, or clear portion of the color filter pattern positioned over it. In some cases, the fifth 2×1 subset of pixels may be read out in a summed mode. The fourth and fifth 2×1 subsets of pixels may be useful, in particular, when each 2×2 subset of red, green, or blue pixels is read out in a summed (or binned) mode. In these instances, the fourth and fifth 2×1 subsets of pixels may still provide PDAF information.

Figure 11:
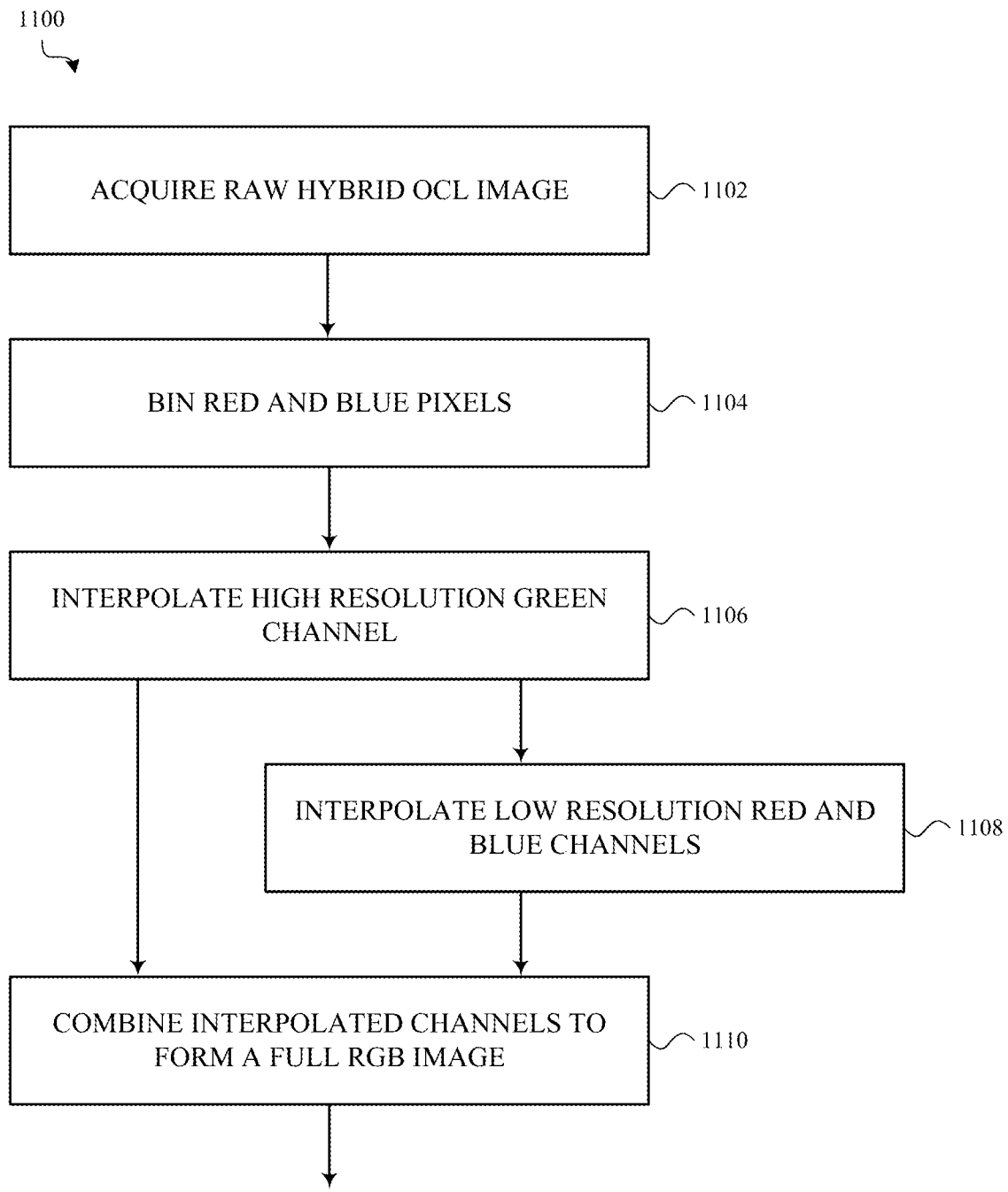
FIG. 11 shows an example method of acquiring an image.

FIG. 11 shows an example method 1100 of reading out the charges accumulated by the pixels of an image sensor. At 1102, the method 1100 may include acquiring a raw hybrid OCL image (i.e., an image acquired using any of the image sensors or imaging areas described herein, in which different size OCLs are disposed over red and blue versus green subsets of pixels). The operations at 1102 may include exposing an array of pixels to light during an integration period.

At 1104, the method 1100 may include binning charges of red and blue subsets of pixels (e.g., for each 4×4 subset of pixels under a Bayer pattern color filter, binning charges of a first 2×2 subset of red pixels to generate a binned red value, and separately binning charges of a second 2×2 subset of blue pixels to generate a binned blue value). The binning may be performed before, during, or after readout of a red value (or values) for the red subset of pixels and a blue value (or values) for the blue subset of pixels.

At 1106, the method 1100 may include interpolating a high resolution green channel from green subsets of pixels. For example, an interpolated green value may be determined for each 2×2 subset of green pixels under a Bayer pattern color filter, and then a green value corresponding to each binned red value and each binned blue value may be determined. Alternatively, and as another example, an interpolated green value may be determined for each pixel in a 2×2 subset of red pixels, and for each pixel in a 2×2 subset of blue pixels, and then a green value corresponding to each binned red value and each binned blue value may be determined from the per pixel green values.

At 1108, the method 1100 may include interpolating a low resolution red channel and a low resolution blue channel from respective red and blue subsets of pixels (e.g., from the respective binned red values or binned blue values) to generate interpolated red values and interpolated blue values.

At 1110, the method 1100 may include combining the interpolated channels (e.g., performing a demosaicing operation) to form a full red, green, blue (RGB) image. For example, the binned red value, the interpolated red values, the binned blue value, the interpolated blue values, the first and second subsets of green values, the at least first interpolated green value, and the at least second interpolated green value may be combined.

Figure 12:
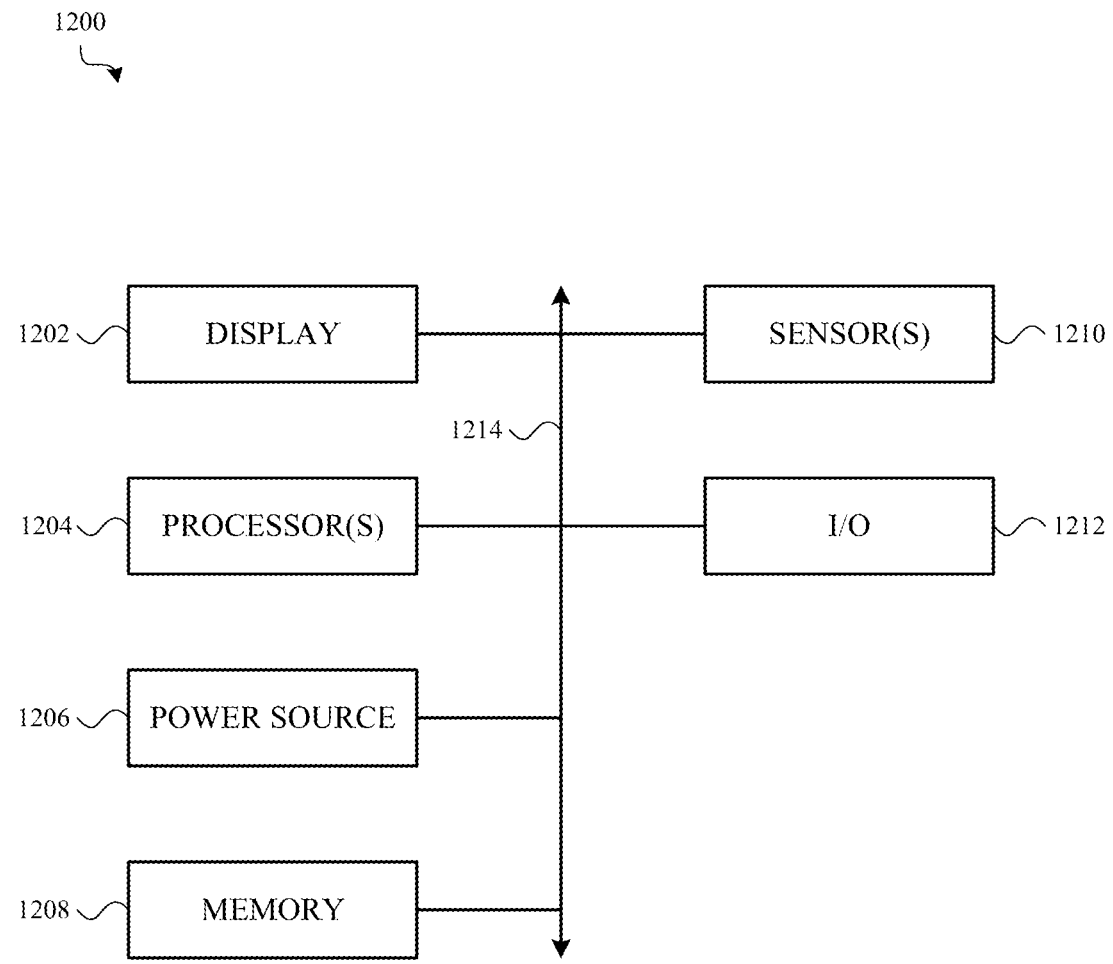
FIG. 12 shows a sample electrical block diagram of an electronic device.

FIG. 12 shows a sample electrical block diagram of an electronic device 1200, which may be the electronic device described with reference to FIGS. 1A-1B, 2, 4, and so on. The electronic device 1200 may include a display 1202 (e.g., a light-emitting display), a processor 1204, a power source 1206, a memory 1208 or storage device, a sensor 1210, and an input/output (I/O) mechanism 1212 (e.g., an input/output device and/or input/output port). The processor 1204 may control some or all of the operations of the electronic device 1200. The processor 1204 may communicate, either directly or indirectly, with substantially all of the components of the electronic device 1200. For example, a system bus or other communication mechanism 1214 may provide communication between the processor 1204, the power source 1206, the memory 1208, the sensor 1210, and/or the input/output mechanism 1212.

The processor 1204 may be implemented as any electronic device capable of processing, receiving, or transmitting data or instructions. For example, the processor 1204 may be a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

It should be noted that the components of the electronic device 1200 may be controlled by multiple processors. For example, select components of the electronic device 1200 may be controlled by a first processor and other components of the electronic device 1200 may be controlled by a second processor, where the first and second processors may or may not be in communication with each other.

The power source 1206 may be implemented with any device capable of providing energy to the electronic device 1200. For example, the power source 1206 may be one or more batteries or rechargeable batteries. Additionally or alternatively, the power source 1206 may be a power connector or power cord that connects the electronic device 1200 to another power source, such as a wall outlet.

The memory 1208 may store electronic data that may be used by the electronic device 1200. For example, the memory 1208 may store electrical data or content such as, for example, audio and video files, documents and applications, device settings and user preferences, timing signals, control signals, data structures or databases, image data, or focus settings. The memory 1208 may be configured as any type of memory. By way of example only, the memory 1208 may be implemented as random access memory, read-only memory, Flash memory, removable memory, other types of storage elements, or combinations of such devices.

The electronic device 1200 may also include one or more sensors 1210 positioned substantially anywhere on the electronic device 1200. The sensor(s) 1210 may be configured to sense substantially any type of characteristic, such as but not limited to, pressure, light, touch, heat, movement, relative motion, biometric data, and so on. For example, the sensor(s) 1210 may include a heat sensor, a position sensor, a light or optical sensor, an accelerometer, a pressure transducer, a gyroscope, a magnetometer, a health monitoring sensor, and so on. Additionally, the one or more sensors 1210 may utilize any suitable sensing technology, including, but not limited to, capacitive, ultrasonic, resistive, optical, ultrasound, piezoelectric, and thermal sensing technology.

The I/O mechanism 1212 may transmit and/or receive data from a user or another electronic device. An I/O device may include a display, a touch sensing input surface such as a track pad, one or more buttons (e.g., a graphical user interface "home" button), one or more cameras, one or more microphones or speakers, one or more ports such as a microphone port, and/or a keyboard. Additionally or alternatively, an I/O device or port may transmit electronic signals via a communications network, such as a wireless and/or wired network connection. Examples of wireless and wired network connections include, but are not limited to, cellular, Wi-Fi, Bluetooth, IR, and Ethernet connections.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An image capture device, comprising:
 an array of pixels, each pixel including a photodetector;
 a Bayer pattern color filter disposed over a 4×4 subset of pixels in the array of pixels, the Bayer pattern color filter defining,
  a first 2×2 subset of pixels sensitive to red light;
  a second 2×2 subset of pixels sensitive to green light;
  a third 2×2 subset of pixels sensitive to green light; and
  a fourth 2×2 subset of pixels sensitive to blue light;
 a set of 1×1 on-chip lenses (OCLs) including a different 1×1 OCL disposed over each pixel in the second 2×2 subset of pixels and the third 2×2 subset of pixels; and
 a set of 2×1 OCLs including a 2×1 OCL disposed over each pixel in the first 2×2 subset of pixels and the fourth 2×2 subset of pixels; wherein, the set of 2×1 OCLs includes,
a first pair of 2×1 OCLs, each 2×1 OCL in the first pair of 2×1 OCLs disposed over a different subset of pixels in the first 2×2 subset of pixels; and
a second pair of 2×1 OCLs, each 2×1 OCL in the second pair of 2×1 OCLs disposed over a different subset of pixels in the fourth 2×2 subset of pixels.

2. The image capture device of claim 1, wherein:
the 4×4 subset of pixels is a first 4×4 subset of pixels;
the Bayer pattern color filter is a first Bayer pattern color filter;
the image capture device comprises a second Bayer pattern color filter disposed over a second 4×4 subset of pixels in the array of pixels, the second Bayer pattern color filter defining,
a fifth 2×2 subset of pixels sensitive to red light;
a sixth 2×2 subset of pixels sensitive to green light;
a seventh 2×2 subset of pixels sensitive to green light; and
an eighth 2×2 subset of pixels sensitive to blue light;
the set of 1×1 OCLs includes a different 1×1 OCL disposed over each pixel in the sixth 2×2 subset of pixels and the seventh 2×2 subset of pixels; and
the set of 2×1 OCLs includes a 2×1 OCL disposed over each pixel in the fifth 2×2 subset of pixels and the eighth 2×2 subset of pixels.

3. The image capture device of claim 2, wherein the set of 2×1 OCLs comprises:
a first pair of 2×1 OCLs, each 2×1 OCL in the first pair of 2×1 OCLs disposed over a different subset of pixels in the first 2×2 subset of pixels; and
a second pair of 2×1 OCLs, each 2×1 OCL in the second pair of 2×1 OCLs disposed over a different subset of pixels in the fifth 2×2 subset of pixels; wherein,
each OCL in the first pair of 2×1 OCLs has a same orientation as each OCL in the second pair of 2×1 OCLs.

4. The image capture device of claim 2, wherein the set of 2×1 OCLs comprises:
a first pair of 2×1 OCLs, each 2×1 OCL in the first pair of 2×1 OCLs disposed over a different subset of pixels in the first 2×2 subset of pixels; and
a second pair of 2×1 OCLs, each 2×1 OCL in the second pair of 2×1 OCLs disposed over a different subset of pixels in the fifth 2×2 subset of pixels; wherein,
each OCL in the first pair of 2×1 OCLs is oriented orthogonally to each OCL in the second pair of 2×1 OCLs.

5. The image capture device of claim 1, wherein:
the 4×4 subset of pixels is a first 4×4 subset of pixels;
the array of pixels further includes,
a second 4×4 subset of pixels is adjacent a first side of the first 4×4 subset of pixels; and
a third 4×4 subset of pixels is adjacent a second side of the first 4×4 subset of pixels, the second side orthogonal to the first side; and
the set of 2×1 OCLs includes,
a first subset of 2×1 OCLs disposed over select pixels of the first 4×4 subset of pixels;
a second subset of 2×1 OCLs disposed over select pixels of the second 4×4 subset of pixels; and
a third subset of 2×1 OCLs disposed over select pixels of the third 4×4 subset of pixels, the third subset of 2×1 OCLs orthogonal to the first subset of 2×1 OCLs and the second subset of 2×1 OCLs.

6. The image capture device of claim 1, wherein:
the 4×4 subset of pixels is a first 4×4 subset of pixels;
the array of pixels further includes,
a second 4×4 subset of pixels is adjacent a first side of the first 4×4 subset of pixels; and
a third 4×4 subset of pixels is adjacent a second side of the first 4×4 subset of pixels, the second side orthogonal to the first side; and
the set of 2×1 OCLs includes,
a first subset of 2×1 OCLs disposed over select pixels of the first 4×4 subset of pixels;
a second subset of 2×1 OCLs disposed over select pixels of the second 4×4 subset of pixels; and
a third subset of 2×1 OCLs disposed over select pixels of the third 4×4 subset of pixels, the first subset of 2×1 OCLs orthogonal to the second subset of 2×1 OCLs and the third subset of 2×1 OCLs.

7. An image capture device, comprising:
an array of pixels, each pixel including a photodetector;
a color filter pattern disposed over a 4×4 subset of pixels in the array of pixels, the color filter pattern defining,
a first 2×2 subset of pixels sensitive to red light;
a second 2×2 subset of pixels sensitive to green light;
a third 2×2 subset of pixels sensitive to green light;
a fourth 2×1 subset of pixels sensitive to green light;
a set of 1×1 on-chip lenses (OCLs) including a different 1×1 OCL disposed over each pixel in the second 2×2 subset of pixels and the third 2×2 subset of pixels;
a set of 2×1 OCLs or 2×2 OCLs including a 2×1 OCL or a 2×2 OCL disposed over each pixel in the first 2×2 subset of pixels and the fourth 2×2 subset of pixels; wherein,
a fifth 2×1 subset of pixels in the 4×4 subset of pixels is covered by an opaque material.

8. The image capture device of claim 7, wherein the set of 2×1 OCLs or 2×2 OCLs comprises:
a first pair of 2×1 OCLs, each 2×1 OCL in the first pair of 2×1 OCLs disposed over a different subset of pixels in the first 2×2 subset of pixels; and
a second pair of 2×1 OCLs, each 2×1 OCL in the second pair of 2×1 OCLs disposed over a different subset of pixels selected from the fourth 2×1 subset of pixels and the fifth 2×1 subset of pixels.

9. The image capture device of claim 7, wherein the set of 2×1 OCLs or 2×2 OCLs comprises:
a first 2×2 OCL disposed over the first 2×2 subset of pixels; and
a second 2×2 OCL disposed over the fourth 2×1 subset of pixels and the fifth 2×1 subset of pixels.

10. The image capture device of claim 7, wherein:
the 4×4 subset of pixels is a first 4×4 subset of pixels;
the color filter pattern is a first color filter pattern;
the image capture device comprises a second color filter pattern disposed over a second 4×4 subset of pixels in the array of pixels, the second color filter pattern defining,
a sixth 2×2 subset of pixels sensitive to red light;
a seventh 2×2 subset of pixels sensitive to green light;
an eighth 2×2 subset of pixels sensitive to green light; and
a ninth 2×2 subset of pixels sensitive to blue light;
the set of 1×1 OCLs includes a different 1×1 OCL disposed over each pixel in the seventh 2×2 subset of pixels and the eighth 2×2 subset of pixels; and
the set of 2×1 OCLs or 2×2 OCLs includes a 2×1 OCL or a 2×2 OCL disposed over each pixel in the sixth 2×2 subset of pixels and the ninth 2×2 subset of pixels.

11. The image capture device of claim 10, wherein the set of 2×1 OCLs or 2×2 OCLs comprises:
- a first pair of 2×1 OCLs, each 2×1 OCL in the first pair of 2×1 OCLs disposed over a different subset of pixels in the first 2×2 subset of pixels; and
- a second pair of 2×1 OCLs, each 2×1 OCL in the second pair of 2×1 OCLs disposed over a different subset of pixels in the sixth 2×2 subset of pixels; wherein,
- each OCL in the first pair of 2×1 OCLs is oriented in a same direction as each OCL in the second pair of 2×1 OCLs.

12. The image capture device of claim 10, wherein the set of 2×1 OCLs or 2×2 OCLs comprises:
- a first pair of 2×1 OCLs, each 2×1 OCL in the first pair of 2×1 OCLs disposed over a different subset of pixels in the first 2×2 subset of pixels; and
- a second pair of 2×1 OCLs, each 2×1 OCL in the second pair of 2×1 OCLs disposed over a different subset of pixels in the sixth 2×2 subset of pixels; wherein,
- each OCL in the first pair of 2×1 OCLs is oriented orthogonally to each OCL in the second pair of 2×1 OCLs.

13. The image capture device of claim 7, wherein:
- the 4×4 subset of pixels is a first 4×4 subset of pixels;
- the array of pixels further includes,
  - a second 4×4 subset of pixels is adjacent a first side of the first 4×4 subset of pixels; and
  - a third 4×4 subset of pixels is adjacent a second side of the first 4×4 subset of pixels, the second side orthogonal to the first side; and
- the set of 2×1 OCLs or 2×2 OCLs includes,
  - a first subset of 2×1 OCLs disposed over select pixels of the first 4×4 subset of pixels;
  - a second subset of 2×1 OCLs disposed over select pixels of the second 4×4 subset of pixels; and
  - a third subset of 2×1 OCLs disposed over select pixels of the third 4×4 subset of pixels, the third subset of 2×1 OCLs orthogonal to the first subset of 2×1 OCLs and the second subset of 2×1 OCLs.

14. The image capture device of claim 7, wherein:
- the 4×4 subset of pixels is a first 4×4 subset of pixels;
- the array of pixels further includes,
  - a second 4×4 subset of pixels is adjacent a first side of the first 4×4 subset of pixels; and
  - a third 4×4 subset of pixels is adjacent a second side of the first 4×4 subset of pixels, the second side orthogonal to the first side; and
- the set of 2×1 OCLs or 2×2 OCLs includes,
  - a first subset of 2×1 OCLs disposed over select pixels of the first 4×4 subset of pixels;
  - a second subset of 2×1 OCLs disposed over select pixels of the second 4×4 subset of pixels; and
  - a third subset of 2×1 OCLs disposed over select pixels of the third 4×4 subset of pixels, the first subset of 2×1 OCLs orthogonal to the second subset of 2×1 OCLs and the third subset of 2×1 OCLs.

15. A method of operating an image sensor, the image sensor including an array of pixels, the array of pixels including 4×4 subsets of pixels disposed under respective Bayer pattern color filters, and each 4×4 subset of pixels including a 2×2 subset of red pixels disposed under a 2×2 on-chip lens (OCL), a 2×2 subset of blue pixels, and first and second 2×2 subsets of green pixels, the method comprising:
- exposing the array of pixels to light during an integration period;
- for each 4×4 subset of pixels,
  - binning charges of the 2×2 subset of red pixels to generate a binned red value;
  - binning charges of the 2×2 subset of blue pixels to generate a binned blue value;
  - interpolating green values of the first and second 2×2 subsets of green pixels to determine at least a first interpolated green value corresponding to the binned red value and at least a second interpolated green value corresponding to the binned blue value; and
  - interpolating the binned red value and the binned blue value to generate interpolated red values and interpolated blue values; and
- combining the binned red value, the interpolated red values, the binned blue value, the interpolated blue values, the first and second subsets of green values, the at least first interpolated green value, and the at least second interpolated green value.

16. The method of claim 15, wherein each pixel in the first and second 2×2 subsets of green pixels is disposed under a separate 1×1 on-chip lens (OCL).

17. The method of claim 15, wherein:
- the 2×2 OCL is a first 2×2 OCL; and
- the 2×2 subset of blue pixels is disposed under a second 2×2 OCL.

* * * * *